(12) United States Patent
Kassi

(10) Patent No.: US 10,790,634 B2
(45) Date of Patent: Sep. 29, 2020

(54) LASER SYSTEM WITH OPTICAL FEEDBACK

(71) Applicant: CENTRE NATIONAL DE LA RECHERCHE SCIENTIFIQUE, Paris (FR)

(72) Inventor: Samir Kassi, Saint Martin d'Hères (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/333,981

(22) PCT Filed: Sep. 27, 2017

(86) PCT No.: PCT/EP2017/074549
§ 371 (c)(1),
(2) Date: Mar. 15, 2019

(87) PCT Pub. No.: WO2018/060285
PCT Pub. Date: Apr. 5, 2018

(65) Prior Publication Data
US 2019/0296519 A1    Sep. 26, 2019

(30) Foreign Application Priority Data

Sep. 27, 2016   (FR) ...................... 16 59107

(51) Int. Cl.
*H01S 3/107*      (2006.01)
*H01S 3/137*      (2006.01)
(Continued)

(52) U.S. Cl.
CPC ............. *H01S 3/137* (2013.01); *G01N 21/39* (2013.01); *H01S 3/107* (2013.01); *H01S 3/1303* (2013.01);
(Continued)

(58) Field of Classification Search
CPC ........ H01S 3/137; H01S 5/0656; H01S 5/142; H01S 3/1303; H01S 5/0085; H01S 5/146;
(Continued)

(56) References Cited

U.S. PATENT DOCUMENTS 5,528,040 A * 6/1996 Lehmann .................. G01J 3/42
                                                              250/343
5,903,358 A    5/1999 Zare et al.
(Continued)

FOREIGN PATENT DOCUMENTS

WO           03/031949 A1    4/2003

*Primary Examiner* — Yuanda Zhang
(74) *Attorney, Agent, or Firm* — Baker & Hostetler LLP

(57) ABSTRACT

A laser system with optical feedback, includes an optical-feedback-sensitive laser which emits, via an output optical fibre, a continuous, frequency-adjustable, propagating, source optical wave, known as the source wave; a resonant optical cavity coupled by means of optical feedback to the laser and configured to generate an intra-cavity wave, one fraction of which returns to the laser in the form of a counter-propagating optical wave; an electro-optic fibre modulator placed on the optical path between the laser and the resonant optical cavity, the electro-optic modulator being configured to generate a phase-shifted source wave by phase-shifting the source wave and, by phase-shifting the counter-propagating optical wave, to generate a phase-shifted counter-propagating wave, known as the feedback wave, which reaches the laser; a phase-control device for generating a control signal for the electro-optic modulator from an error signal representative of the relative phase between the source wave and the feedback wave, such as to cancel the relative phase between the source wave and the feedback wave.

14 Claims, 12 Drawing Sheets

(51) Int. Cl.
*G01N 21/39* (2006.01)
*H01S 5/14* (2006.01)
*H01S 5/00* (2006.01)
*H01S 3/13* (2006.01)
*H01S 5/065* (2006.01)

(52) U.S. Cl.
CPC .......... *H01S 5/0085* (2013.01); *H01S 5/0656* (2013.01); *H01S 5/142* (2013.01); *H01S 5/146* (2013.01); *G01N 2021/391* (2013.01); *G01N 2021/393* (2013.01); *G01N 2021/399* (2013.01)

(58) Field of Classification Search
CPC .. H01S 3/107; G01N 21/39; G01N 2021/393; G01N 2021/399; G01N 2021/391
See application file for complete search history.

(56) References Cited

U.S. PATENT DOCUMENTS

| | | | |
|---|---|---|---|
| 6,466,322 B1 | 10/2002 | Paldus et al. | |
| 7,012,696 B2* | 3/2006 | Orr | G01J 3/42 356/437 |
| 9,097,656 B2* | 8/2015 | Fermann | G01N 33/0027 |
| 2013/0175450 A1* | 7/2013 | Scherer | G01N 21/3504 250/353 |
| 2013/0228688 A1 | 9/2013 | Plusquellic et al. | |
| 2014/0123729 A1* | 5/2014 | Kachanov | H01S 5/0028 73/24.02 |
| 2014/0125993 A1* | 5/2014 | Kachanov | G01J 3/26 356/519 |
| 2014/0320856 A1* | 10/2014 | McKeever | G01J 3/4338 356/326 |

* cited by examiner

LASER SYSTEM WITH OPTICAL FEEDBACK

CROSS-REFERENCE TO RELATED APPLICATIONS

This application is a National Stage of International patent application PCT/EP2017/074549, filed on Sep. 27, 2017, which claims priority to foreign French patent application No. FR 1659107, filed on Sep. 27, 2016, the disclosures of which are incorporated by reference in their entirety.

FIELD OF THE INVENTION

The present description relates to a laser system comprising a laser coupled by optical feedback to a resonant optical cavity and to a method for generating an optical wave by means of such a laser system.

BACKGROUND

Patent application WO 03/031949 describes a laser system comprising a laser coupled by optical feedback to a resonant optical cavity that is external to the laser, for detecting traces of gas. One portion of a continuous-waveform source wave emitted by the laser is injected into a resonant optical cavity by way of an optical coupling system. The optical cavity is located in a chamber into which a gas may be injected for analysis. One portion of the optical wave generated in the resonant optical cavity, here called the intra-cavity wave, is sent back to the laser. When the laser is sensitive to optical feedback, this being the case for example of semiconductor lasers, an optical feedback effect occurs such that the frequency of the source wave becomes slaved to that of the resonant mode of the resonant optical cavity. This results in spectral narrowing of the frequency spectrum of the source wave, which becomes centered on the frequency of a resonant mode of the resonant optical cavity.

Optical feedback, such as described in the aforementioned patent application, allows, by virtue of the control of the spectral characteristics of the source wave emitted by the laser, both the emission wavelength of the laser and the spectral width at this wavelength, the injection of photons into the resonant optical cavity to be optimized and the sensitivity of the laser system with respect to detection of traces of gas to be increased.

However, these slaving and spectral-narrowing effects only occur under certain conditions. It is in particular necessary for the wave emerging from the resonant optical cavity and directed toward the laser to be in phase with the intra-cavity wave produced by the laser. In setups such as those described in the aforementioned patent application, this implies controlling the distance between the laser and the resonant optical cavity with great precision, since a phase shift appears if the total optical path of one laser/cavity round-trip is not a multiple of the wavelength emitted by the laser.

Furthermore, on account of thermomechanical effects or pressure- or temperature-related variations in the refractive index of air, these conditions can generally be maintained passively only for a limited time, of the order of about a few seconds.

Generally, the relative phase between the wave emerging from the resonant optical cavity and the source wave of the laser is a function of wavelength. The aforementioned patent application exploits the fact that, at a distance that is a multiple of the length of the arms of the resonant optical cavity, the electric field of the resonant wave is necessarily in phase with that of the laser, whatever the wavelength: specifically, the electric field is necessarily zero at resonance not only on the back mirrors of the optical cavity but also on the mirrors of the cavity of the laser. For example, by placing the laser such that it is located, with respect to the input mirror of the resonant optical cavity at a distance equal to the length of the arm of the optical cavity that is not on the axis of the laser, it is possible to make the emission wavelength of the laser vary without needing to rectify the distance between the laser and the resonant optical cavity. All that is then required is to use an element to finely adjust the distance between the laser and the resonant optical cavity. This element is for example a mirror, mounted on a piezoelectric transducer, allowing the distance between the laser and the resonant optical cavity to be finely adjusted. Such an adjustment however introduces a limitation in particular because of the limited passband of the piezoelectric transducer and of the time necessary to find the position of the mirror allowing the relative phase between the source wave and the wave output by transmission from the resonant optical cavity to be cancelled out.

In practice, these constraints together mean that the adjustment of the laser system, in a given environment, with a view to obtaining optical feedback at various laser emission frequencies, may require several hours.

There would thus appear to be a need to overcome these constraints and/or simplify the laser-system adjustment operations.

SUMMARY OF THE INVENTION

The subject of the present description is, according to a first aspect, a laser system with optical feedback comprising:
  a laser that is sensitive to optical feedback and intended to emit, via an output optical fiber, a continuous-waveform forward-propagating source optical wave, called the source wave, the frequency of which is adjustable;
  a resonant optical cavity that is coupled by optical feedback to the laser and that is configured to generate an intra-cavity wave a fraction of which is returned to the laser in the form of a back-propagating optical wave;
  a fiber-based electro-optical modulator placed on the optical path between the laser and the resonant optical cavity, the electro-optical modulator being configured to generate a phase-shifted source wave by phase shifting the source wave and to generate, by phase shifting the back-propagating optical wave, a phase-shifted back-propagating wave, called the feedback wave, which reaches the laser;
  a phase-controlling device for generating a signal for controlling the electro-optical modulator from an error signal representative of the relative phase between the source wave and the feedback wave, so as to cancel out the relative phase between the source wave and the feedback wave.

The relative phase between the source wave and the feedback wave is here also called the relative laser/cavity phase or even the laser/cavity phase shift. The relative laser/cavity phase is denoted $\Phi_{lc}$. The relative laser/cavity phase $\Phi$ is determined modulo $2\pi$, and given by an angular value expressed in radians. Likewise, the phase adjustment $\Delta\Phi$ (or phase shift) made by the electro-optical modulator is given by an angular value, expressed in radians. This phase adjustment $\Delta\Phi$ corresponds to the total adjustment over one there/back laser/cavity trip of the source wave, i.e. the sum of the phase adjustment $\Delta\Phi_1$ made to the source wave and of the phase adjustment $\Delta\Phi_2$ made to the feedback wave. This phase adjustment $\Delta\Phi$ may be smaller than, equal to or larger than $2\pi$. A phase adjustment of $\Delta\Phi=2\pi$ ($-2\pi$, respectively) corresponds to a lengthening (shortening, respectively) of the optical path by a length equal to the wavelength $\lambda$ of the source wave. More generally, a phase adjustment of $\Delta\Phi=2\pi\ \delta/\lambda$ corresponds to an adjustment of the optical path by a (positive or negative) length $\delta$.

The fiber-based electro-optical modulator is used to apply a phase correction, and more precisely to modify the relative phase between the source wave and the feedback wave. The constraint on the distance between the laser and the resonant optical cavity is thus completely removed because the electro-optical modulator allows a sufficiently large range of variation in refractive index to be obtained to allow a phase adjustment of more than one half-wavelength to be achieved in all the wavelength range of a laser source. This phase adjustment $\Delta\Phi$ is made both to the source wave and to the back-propagating wave that is delivered to the electro-optical modulator, from which wave the feedback wave is generated. The phase adjustment, measured over a round trip, may therefore correspond to a lengthening of the optical path by more than one wavelength $\lambda$ of the source wave. The phase adjustment $\Delta\Phi$ made by the electro-optical modulator amounts to an adjustment (i.e. to a lengthening or shortening) of the optical path of the source wave such that the laser/cavity phase shift is zero modulo $2\pi$, this corresponding to an optical path that is an integer multiple of the wavelength $\lambda$ of the source wave. When the laser/cavity phase shift is zero, the degree of coupling between the laser and the resonant optical cavity is maximum and the transmission of the resonant optical cavity is also maximum.

Moreover, by replacing the mechanical element for adjusting the distance between the laser and the resonant optical cavity and the mirror with an electro-optical modulator of adjustable refractive index, configured to make a phase adjustment, a solution is obtained that is flexible, simple and that allows an almost-instantaneous adjustment of the laser/cavity phase shift to be efficiently achieved. In addition, contrary to the aforementioned solution, which uses an iterative process to find the position of the mirror allowing the laser/cavity phase shift to be cancelled out whatever the wavelength, the phase correction generated by means of the electro-optical modulator allows the laser/cavity phase shift to be adjusted depending on the wavelength of the forward-propagating source optical wave. The response time is shorter than 0.1 nanoseconds (ns), much shorter than the response time of a few milliseconds (ms) required for a mechanical adjustment of a mirror. Furthermore, the phase correction may be applied almost instantaneously on the basis of an error signal SE representative of the relative phase. In addition, the phase adjustment $\Delta\Phi$ to be made may be set computationally, on the basis for example of stored relative-phase measurements carried out for various wavelength values, so as to further increase the rapidity with which the adjustment is made.

Moreover, the use of a laser the output of which is fiber-coupled is a notable advance in that it not only allows the laser to be rapidly replaced, but it also allows fiber-based optical modules performing additional functions to be easily inserted, such as modules enabling: optical beams to be split (fiber-optic splitter or fiber-optic circulator); sequential or parallel multiplexing (optical switches or WDM or wavelength demultiplexer) of laser beams emitted at various wavelengths; optical-beam amplification (fiber-optic amplifier SOA or BOA) in order to control the degree of optical feedback or the output power of the laser system); etc.

In at least one embodiment of the laser system the resonant optical cavity is formed by at least two mirrors including at least one output mirror; and the phase-controlling device is configured to generate the signal for controlling the electro-optical modulator from a fraction of the intra-cavity wave that exits from the resonant optical cavity via said output mirror.

In at least one embodiment of the laser system the resonant optical cavity is formed by at least two mirrors including an input mirror; and the phase-controlling device is configured to generate the signal for controlling the electro-optical modulator from a wave resulting from interference between a fraction of the phase-shifted source wave reflected by the input mirror and a fraction of the intra-cavity wave transmitted in the back-propagation direction via the input mirror of the resonant optical cavity.

In at least one embodiment of the laser system, the phase-controlling device is configured to generate the signal for controlling the electro-optical modulator from a fraction of the back-propagating optical wave sampled at the input of the electro-optical modulator in the back-propagation direction.

In at least one embodiment of the laser system, the electro-optical modulator is furthermore configured to generate a modulated optical signal by modulating, depending on the error signal, the phase of the source wave about an average value and the phase-controlling device is configured to produce the control signal via a lock-in detection method from a fraction of the back-propagating optical wave sampled at the input of the electro-optical modulator in the back-propagation direction.

In at least one embodiment of the laser system, the output optical fiber is a polarization-maintaining fiber.

In at least one embodiment of the laser system, the laser is devoid of an optical isolator at its output.

In at least one embodiment, the laser system comprises at least one fiber-based optical component placed on the optical path of the source wave, before or after the fiber-based electro-optical modulator, the fiber-based optical component being a component selected from the group made up of an optical amplifier, an optical coupler, and an optical circulator. Generally, this fiber-based optical component may be a fiber-based optical component that acts on the phase, frequency and/amplitude of the forward-propagating and/or back-propagating waves.

In at least one embodiment, the laser system according to the present description is a multi-source laser system, i.e. it comprises at least a second laser configured to be coupled by optical feedback to the resonant optical cavity.

In at least one first embodiment, the laser system comprises: at least one second laser that is sensitive to optical feedback and that emits, via an output optical fiber, a second continuous-waveform forward-propagating source optical wave the frequency of which is adjustable; and a fiber-based optical switch configured to receive the forward-propagating source optical waves output from the first laser and said at least one second laser, for selecting one of the received forward-propagating source optical waves and for transferring, to the fiber-based electro-optical modulator, the selected forward-propagating source optical wave.

In at least one second embodiment, the laser system comprises: at least one second laser that is sensitive to optical feedback and that emits, via an output optical fiber, a second continuous-waveform forward-propagating source optical wave the frequency of which is adjustable; at least one second fiber-based electro-optical modulator placed on the optical path between a corresponding said second laser and the resonant optical cavity, each said second electro-optical modulator being configured to generate a phase-shifted forward-propagating optical wave by phase shifting a corresponding said second forward-propagating source optical wave; and a fiber-based optical multiplexer configured to receive the phase-shifted forward-propagating optical waves output from the electro-optical modulator and said at least one second electro-optical modulator, for generating a multiplexed optical wave by frequency multiplexing the received phase-shifted forward-propagating optical waves, for supplying the resonant optical cavity with the multiplexed wave and for generating demultiplexed waves by demultiplexing a fraction of the intra-cavity wave that reaches the multiplexer in the form of a back-propagating optical wave; each said second electro-optical modulator furthermore being configured to generate, by phase shifting one of the demultiplexed waves, a corresponding back-propagating optical wave that reaches the corresponding second laser; the phase-controlling device being configured to generate a control signal for each second electro-optical modulator from an error signal representative of the relative phase between a corresponding second forward-propagating source optical wave and the corresponding back-propagating optical wave reaching the corresponding second laser, so as to cancel out the relative phase between the corresponding forward-propagating source optical wave and the corresponding back-propagating optical wave. In at least one particular embodiment, the laser system furthermore comprises an optical component for generating a combined optical wave by combining a fraction of the source wave (of the feedback wave, respectively) output from the laser and a fraction of the second forward-propagating source optical wave (of the second back-propagating optical wave, respectively) output from the second laser.

In at least one third embodiment, the laser system comprises: a second laser that is sensitive to optical feedback and that emits, via an output optical fiber, a second continuous-waveform forward-propagating source optical wave the frequency of which is adjustable; a second fiber-based electro-optical modulator placed on the optical path between the second laser and the resonant optical cavity, the second electro-optical modulator being configured to generate a second phase-shifted forward-propagating optical wave by phase shifting the second forward-propagating source optical wave; and an optical combiner for generating, from a first phase-shifted forward-propagating optical wave generated by the electro-optical modulator and the second phase-shifted forward-propagating optical wave, a combined wave comprising two orthogonally polarized waves, for supplying the resonant optical cavity with the combined wave and for generating split waves by splitting, in a fraction of the intra-cavity wave that reaches the optical combiner in the form of a back-propagating optical wave, fractions of orthogonally polarized waves; the second electro-optical modulator furthermore being configured to phase shift one of the split waves and to produce a second back-propagating optical wave that reaches the second laser; the laser system furthermore comprising a second phase-controlling device for generating a second signal for controlling the second electro-optical modulator from a second error signal representative of the relative phase between the second forward-propagating source optical wave and the second back-propagating optical wave, so as to cancel out the relative phase between the second forward-propagating source optical wave and the second back-propagating optical wave.

The subject of the present description, according to a second aspect, is a gas-detecting system comprising a laser system according to the present description, wherein the resonant optical cavity defines a chamber intended to receive at least one gas, the gas-detecting system comprising an analyzing device for analyzing at least one optical wave generated by the laser system. This analysis may for example be carried out in order to analyze losses introduced by the gas, for example losses due to absorption. The absorption spectrum of the gas present in the cavity may be determined from a transmitted optical wave output from the resonant optical cavity. A CRDS (Cavity Ring Down Spectroscopy) measurement may also be carried out on the basis of a transmitted optical wave output from the resonant optical cavity.

The subject of the present description, according to a third aspect, is a method for generating an optical wave, comprising: generating a continuous-waveform forward-propagating source optical wave, called the source wave, the frequency of which is adjustable, via an output optical fiber of a laser that is sensitive to optical feedback; coupling, by optical feedback, the laser to a resonant optical cavity configured to generate an intra-cavity wave a fraction of which is returned to the laser in the form of a back-propagating optical wave; generating, with a fiber-based electro-optical modulator placed on the optical path of the source wave between the laser and the resonant optical cavity, a phase-shifted source wave by phase shifting the source wave and, by phase shifting the back-propagating optical wave, a phase-shifted back-propagating wave, called the feedback wave, which reaches the laser; and generating a signal for controlling the electro-optical modulator from an error signal representative of the relative phase between the source wave and the feedback wave, so as to cancel out the relative phase between the source wave and the feedback wave.

BRIEF DESCRIPTION OF THE DRAWINGS

Other advantages and features of the techniques presented above will become apparent on reading the detailed description below, which description is given with reference to the figures, in which.

DETAILED DESCRIPTION

In the various embodiments that will be described with reference to the figures, elements that are similar or identical have been given the same references.

Figure 1:
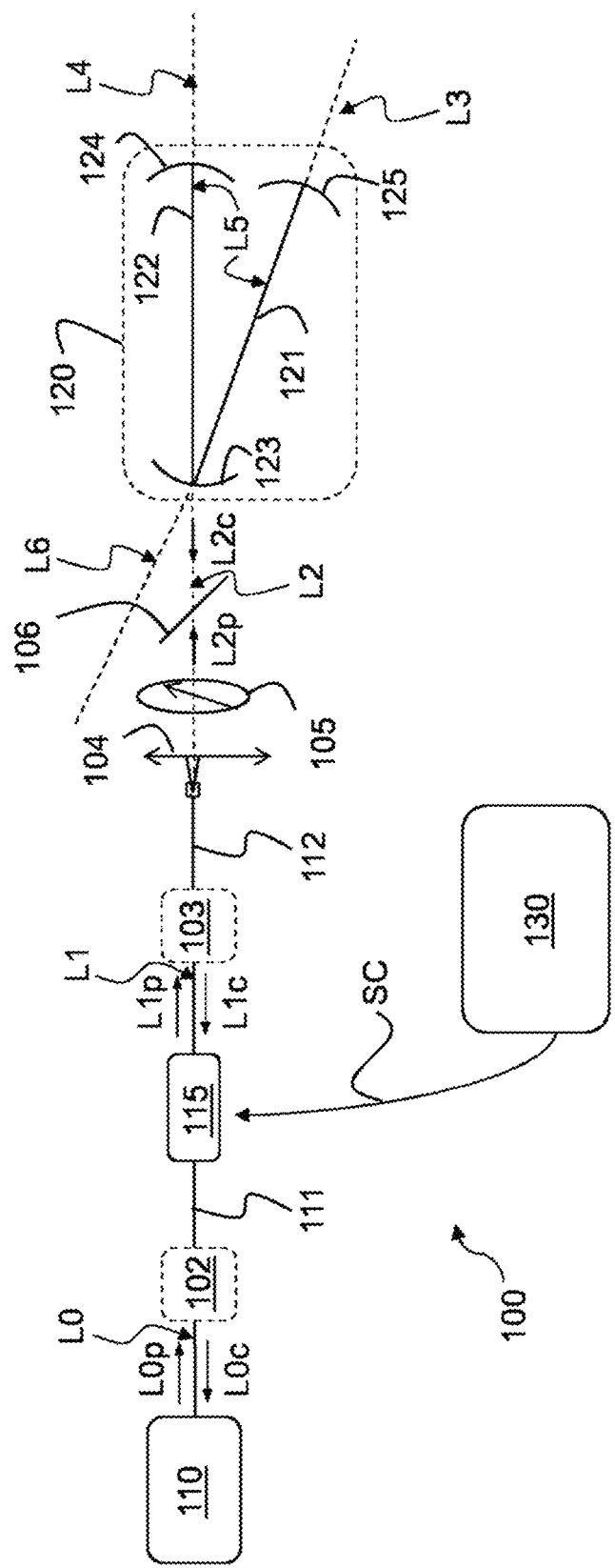
FIG. 1 illustrates one embodiment of a laser system with optical feedback.

FIG. 1 schematically illustrates one embodiment of a laser system 100 with optical feedback. Various optical waves are generated within the laser system 100. In the context of the present description, an optical wave is said to be forward-propagating if it propagates from a laser to a resonant optical cavity and back-propagating in the contrary case.

The laser system 100 comprises a laser 110, which is intended to emit via an output optical fiber 111, a continuous-waveform forward-propagating source wave L0p, also called the source wave, the frequency of which is adjustable.

The laser 110 is a laser that is sensitive to optical feedback, for example a semiconductor laser of the type used in telecommunications. In at least one embodiment, the laser 110 is devoid of an optical isolator at its output, so as to increase the sensitivity of the laser to the optical feedback.

In at least one embodiment, the output optical fiber 111 of the laser is a polarization-maintaining fiber so as to stabilize the polarization of the source wave. The frequency of the source wave L0p is typically adjustable in a range of 1 THz in the case of the diodes used for telecommunications, the central emission frequency of a particular diode possibly being comprised between 176 and 240 THz.

The laser system 100 comprises a resonant optical cavity 120, which is coupled by optical feedback to the laser 110, and configured to generate an intra-cavity wave L5. The resonant optical cavity 120 comprises at least one optical arm 121 that is limited by two mirrors 123 and 124. In the embodiment described with reference to FIG. 1, a configuration comprising two arms 121, 122 will be described. Such a configuration comprising two or more arms simplifies implementation. In the example of FIG. 1, the resonant optical cavity 120 is bounded by three mirrors 123, 124, 125. The two optical arms 121, 122 make an angle to each other. The two arms 121, 122 are not necessarily of identical length. The optical arm 122 is the arm that is bounded by the folding mirror 123 and the output mirror 124. The optical arm 121 is the arm that is bounded by the folding mirror 123 and the output mirror 125.

Depending on the targeted applications, the resonant optical cavity 120 may be empty or filled with a gas, a gas mixture, aerosols, or any other composition, for example a liquid if the mirrors are suitable.

The laser system 100 comprises a fiber-based electro-optical modulator 115 placed on the optical path of the forward-propagating source optical wave L0p, between the laser 110 and the resonant optical cavity 120. The electro-optical modulator 115 is optically connected to the laser 110 via the optical fiber 111 that transmits the forward-propagating source optical wave L0p.

The electro-optical modulator 115 is configured to adjust and/or modulate the phase of the forward-propagating source optical wave L0p and to generate a forward-propagating optical wave L1p that is phase-shifted with respect to the forward-propagating source optical wave L0p and/or that has modulation sidebands.

The laser system 100 furthermore comprises a phase-controlling device 130 for obtaining an error signal SE and generating a signal SC for controlling the electro-optical modulator 115 depending on the error signal SE.

An optical fiber 112, at the output of the electro-optical modulator 115, transmits the forward-propagating phase-shifted optical wave L1p. Between the optical fiber 112 and the resonant optical cavity 120, the optical path is through free space.

One or more lenses 104 may be placed at the output of the optical fiber 112 in order to collimate the forward-propagating phase-shifted optical wave L1p exiting from the optical fiber 112 and to generate a forward-propagating optical wave L2p the spatial structure of which is suitable for exciting a resonant mode of the cavity 120. The forward-propagating optical wave L2p is transmitted through free space before being injected into the resonant optical cavity 120. One or more plate beamsplitters 106 may be placed on the optical path of the forward-propagating optical wave L2p in order to sample a fraction of the forward-propagating optical wave L2p. The optical arm 122 is optically aligned on the optical path of the forward-propagating optical wave L2p.

Various optical waves are thus generated within the laser system. These optical waves comprise the source optical wave L0 a the output of the laser 110, the phase-shifted optical wave L1 at the output of the electro-optical modulator 115, the optical wave L2 at the input of the resonant optical cavity 120, the optical wave L3 output from the resonant optical cavity 120, the optical wave L4 output from the resonant optical cavity 120, the intra-cavity wave L5 and the optical wave L6 output from the resonant optical cavity 120.

The intra-cavity wave L5 is a stationary wave resulting from the superposition of two waves forward-propagating in opposite directions: a forward-propagating wave L5p forward-propagating from the folding mirror 123 to the output mirror 125 or 124 and a back-propagating wave L5c forward-propagating from the output mirror 125 or 124 to the folding mirror 123. A fraction of the back-propagating wave L5c exits from the resonant optical cavity and propagates toward the laser 110.

When a stationary intra-cavity wave L5 forms in the resonant optical cavity 120, the back-propagating optical wave L5c is reinjected via a reverse path into the laser 110, giving rise to the optical-feedback effect. On this return trip to the laser 110 the back-propagating waves L0c, L1c and L2c propagate.

Thus, the optical wave L2 at the input of the resonant optical cavity 120 is composed of a forward-propagating wave L2p output from the optical fiber 112 and a back-propagating wave L2c. In particular, the back-propagating wave L2c corresponds to the fraction of the back-propagating optical wave L5c transmitted through the folding mirror 123 on the axis of the optical arm 122.

Likewise, the optical wave L1 at the output of the electro-optical modulator 115 is composed of a forward-propagating wave L1p generated by the electro-optical modulator 115 and a back-propagating wave L1c. Likewise, the back-propagating wave L1c corresponds to the fraction of the back-propagating optical wave L5c that reaches the electro-optical modulator 115. Since the action of the electro-optical modulator 115 is identical in both propagation directions, it modifies by an identical amount, and in the same way, the phase of the forward-propagating source wave L0p and the phase of the back-propagating wave L1c.

The electro-optical modulator achieves a modification in the optical path of the incident wave via a change in the index of a material under the effect of a voltage. The total phase adjustment $\Delta\Phi$ (or phase shift) made by the electro-optical modulator is therefore the sum of two phase shifts: a first phase shift $\Delta\Phi_1$ applied on the outward trip to the incident forward-propagating wave; and a second phase shift $\Delta\Phi_2$ applied on the return trip to the incident back-propagating wave. The total phase adjustment $\Delta\Phi$ made with the electro-optical modulator is therefore $\Delta\Phi=\Delta\Phi_1+\Delta\Phi_2=2*\Delta\Phi_1$ on a there/back laser/cavity round-trip of the source wave. Thus all that is required is for the electro-optical modulator to be able to produce a phase shift corresponding to an optical-path lengthening/shortening of a half-wavelength for the electro-optical modulator to be able to adjust this optical path by an integer multiple of the wavelength of the source wave L0p.

Lastly, the optical wave L0 at the output of the laser 110 is composed of a forward-propagating source wave L0p generated by the laser 110 and a back-propagating wave L0c that reaches the laser 110. The back-propagating wave L0c corresponds to the fraction of the back-propagating optical wave L5c that reaches the output of the laser 110.

Each of the back-propagating waves L2c, L1c and L0c thus result from the back-propagating wave L5c.

The optical wave L3, generated on the axis of the arm 121 of the resonant optical cavity 120, results from the transmission of a fraction of the forward-propagating wave L5p through the output mirror 125. Likewise, the optical wave L4, generated on the axis of the arm 122 of the resonant optical cavity 120, results from the transmission of a fraction of the forward-propagating wave L5p through the output mirror 124. The optical wave L6, generated on the axis of the arm 121 of the resonant optical cavity 120 and at an opposite angle to the angle of incidence of the forward-propagating optical wave L2p, results from the combination (optical interference) of a reflected optical wave L2r, itself resulting from reflection from the folding mirror 123 of the forward-propagating wave L2p, and of the fraction of the back-propagating optical wave L5c transmitted through the folding mirror 123 on the axis of the optical arm 121.

As already indicated above, the phase shift between the back-propagating wave L0c delivered to the laser 110 and the forward-propagating source wave L0p is called the laser/cavity phase shift: this phase shift corresponds to a phase shift accumulated on the complete their-back laser/cavity trip made by the forward-propagating source wave L0p. Likewise, the total there-back optical trip between the output mirror of the cavity of the laser and the folding mirror 123 of the resonant optical cavity 120 is called the laser/cavity optical path.

When the laser/cavity phase shift is zero, the fraction of the back-propagating optical wave L5c transmitted through the folding mirror 123 on the axis of the optical arm 121 does not interfere with the forward-propagating wave L2p, because the forward-propagating wave L2p is reflected with an angle equal to that of the arms, these two waves not being geometrically superposed. In contrast, the optical wave L6 results from interference between the reflected optical wave L2r and the fraction of the back-propagating optical wave L5c transmitted through the folding mirror 123 on the axis of the optical arm 121.

In the cavity of the laser 110, a stationary field is established and resonates within the cavity of the laser 110. This field internal to the laser 110 is necessarily zero at the output facets of the cavity of the laser 110. In the same way, a stationary optical wave develops in the resonant optical cavity 120 and the electric field is zero on the mirrors referred to as the "back" mirrors of the cavity, i.e. the mirrors 125 and 124. The intra-cavity optical wave that is reflected from the mirror 124 and returned to the laser has a field that is necessarily zero at a point located, with respect to the mirror 124, at a distance d121+d122, corresponding to the sum of the lengths of the two arms, or even to the distance d121 of the folding mirror 123. This point is one of the points at which, whatever the resonant frequency excited in the resonant optical cavity, the field is zero, since this point corresponds virtually (i.e. via a "mirror" effect) to a point equivalent to the mirror 125 on which the field is zero at the resonance of the resonant optical cavity.

The adjustment of the phase of the forward-propagating source optical wave L0p by the electro-optical modulator 115 is made depending on the error signal SE generated by the phase-controlling device 130. To this end, the phase-controlling device 130 generates a control signal SC for controlling the electro-optical modulator 115 that depends on the error signal SE. The error signal SE may be generated from one or more optical waves generated within the laser system.

In at least one embodiment, the error signal SE generated by the phase-controlling device 130 is representative (modulo $2\pi$) of the laser/cavity phase shift and therefore equal to zero when the relative laser/cavity phase is zero. The signal SC for controlling the electro-optical modulator 115 is determined from the error signal SE so as to cancel out the relative laser/cavity phase. The adjustment of the phase of the forward-propagating source optical wave L0p by the electro-optical modulator 115 is made depending on the control signal SC thus produced.

The phase adjustment made by the electro-optical modulator 115 to the optical wave L0p and L1c allows the laser/cavity optical path to be adjusted so as to cancel out the relative laser/cavity phase. In at least one embodiment, a phase modulation is furthermore applied by the electro-optical modulator 115 to the forward-propagating source wave L0p or to the forward-propagating phase-shifted wave L1p so as to generate an error signal SE representative of the laser/cavity phase shift and the signal SC for controlling the electro-optical modulator 115 that allows the relative laser/cavity phase to be cancelled out.

The error signal SE may be generated from one or more optical waves generated within the laser system. Various embodiments are described below with reference to FIGS. 2A-2E.

Optionally, the laser system 100 may comprise one or more polarizers 105 placed on the free-space path of the optical wave L2 so as, for example, to control the polarization of the forward-propagating optical wave L2p reaching the resonant optical cavity and/or the polarization of the back-propagating optical wave L2c, so as to attenuate the degree of feedback provided by the resonant optical cavity 120 to the laser 110.

Optionally, the laser system 100 may comprise one or more fiber-based optical components 102, 103 placed on the optical path between the laser 110 and the resonant optical cavity 120, before or after the electro-optical modulator 115, i.e. placed in the optical fiber 111 or in the optical fiber 112, respectively.

The optical component 103 is for example a fiber-based optical circulator the degree of isolation of which may be modulated by virtue of the polarizer group 105, and which is configured to sample, in the back-propagation direction, some of the forward-propagating back-propagating optical wave L2c in order to determine the intensity thereof. In at least one embodiment, the fiber-based optical circulator is used to generate the error signal SE using a fiber-optic photodiode or an absorption signal when the resonant optical cavity 120 is filled with a substance to be studied.

The optical component 102 (103, respectively) is for example a fiber-based coupler configured to sample, in the propagation direction, some of the forward-propagating optical wave L0p (of the forward-propagating optical wave L1p, respectively) in order, on the one hand, to evaluate the intensity of this forward-propagating wave (this is for example useful for normalization of the cavity-transmission signal L3, L4, L6 or L2c in the case where the resonant optical cavity 120 serves for analysis of the substance present in the resonant optical cavity 120) and, on the other hand, to make it so that, with a view to other applications, some of the radiation has spectral qualities that are greatly improved by the optical-feedback effect. The fiber-based coupler 102 (103, respectively) may also be used to sample, in the back-propagation direction, some of the back-propagating optical wave L1c (of the back-propagating optical wave L2c, respectively). Sampling in the back-propagation direction allows the intensity of the wave L2C coming from the resonant optical cavity 120 to be evaluated and, for example, an error signal SE to be extracted therefrom using a fiber-optic photodiode or an absorption signal if the resonant optical cavity 120 is filled with a substance to be studied.

The optical component 102 (103, respectively) is for example a fiber-based optical amplifier allowing, in the propagation and back-propagation direction, the source optical wave L0 (the optical wave L1, respectively) to be amplified in order to finely control the degree of optical feedback by controlling the amplification gain. This simplifies the optimization of the degree of feedback between the laser 110 and the resonant optical cavity 120 in particular in the case of an application to the study of a substance placed in the resonant optical cavity 120. This also allows the losses induced by the potential presence of an optical isolator in the laser 110 to be compensated for. This also makes it possible to use very few photons of the laser 110 with a view to achieving the optical feedback and, by virtue of the optical component 102 or 103, to reserve almost all thereof for other applications.

Figure 2A:
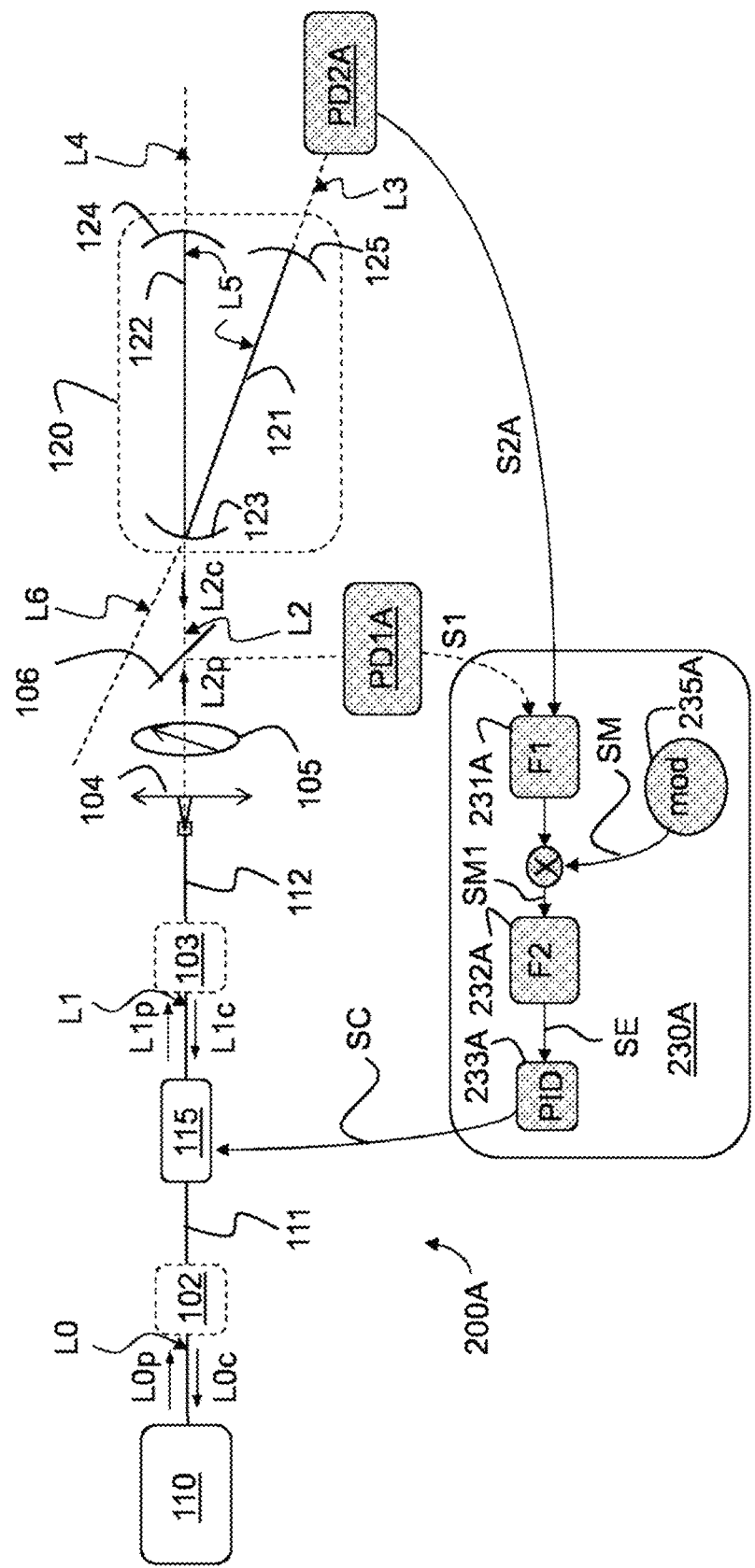
FIGS. 2A-2E illustrate various embodiments of a laser system with optical feedback using various methods for generating a signal for controlling the electro-optical modulator.

FIG. 2A schematically illustrates one embodiment of a laser system 100A with optical feedback using a first method for generating a signal SC for controlling the electro-optical modulator 115. The laser system 200A comprises a laser 110, which is sensitive to optical feedback, a resonant optical cavity 120, an optical fiber 111, an optical fiber 112 and a fiber-based electro-optical modulator 115, these elements being identical or similar to those described with reference to FIG. 1 and optically connected as illustrated in FIG. 1. The laser system 200A may furthermore comprise the optical components 102, 103, 104, 105, 106 described with reference to FIG. 1.

The laser system 200A furthermore comprises a photodiode PD1A for generating, from a fraction of the forward-propagating optical wave L2p, sampled by the plate beamsplitter 106, an electrical current the magnitude of which depends on the light intensity of the fraction of the forward-propagating optical wave L2p.

The laser system 200 A furthermore comprises a photodiode PD2A for generating, from the optical wave L3, an electrical current the magnitude of which depends on the light intensity of the optical wave L3.

The laser system 200A furthermore comprises a phase-controlling device 230A configured to obtain an error signal SE representative of the laser/cavity phase shift and to generate the signal SC for controlling the fiber-based electro-optical modulator 115 depending on the error signal SE so as to cancel out the relative laser/cavity phase. The phase-controlling device 230A is configured to generate the control signal SC from the optical wave L3 transmitted via the output mirror 125 and, optionally, from the forward-propagating optical wave L2p at the input of the resonant optical cavity 120. More precisely, the control signal SC is generated from electrical signals generated by the photodiode PD2A, and, optionally, by the photodiode PD1A.

The phase-controlling device 230A comprises a bandpass filter 231A for filtering the signal generated by the photodiode PD2A in order to carry out a pre-processing operation aiming to remove frequencies outside of the 9-11 kHz band. A modulation signal SM is mixed with the signal output from the first bandpass filter 231A in order to generate a modulated signal SM1. The modulation signal SM is a signal of low enough frequency, on account of the fact that this first method for obtaining the error signal SE is limited by the response time of the resonant optical cavity 120. The modulation signal SM has a frequency for example of 10 kHz and an amplitude of 1 V. A lowpass filter 232A is applied to the modulated signal in order to generate an error signal that is zero when the transmission of the resonant optical cavity is maximum. The cut-off frequency of the lowpass filter is chosen to be lower than the modulation frequency, for example 1 kHz. A PID (proportional, integral, derivative) controller 233A then allows, from the error signal SE, the signal SC for controlling the electro-optical modulator 115 to be generated. Optionally, the signal generated by the photodiode PD1A is used to normalize the electrical signal generated by the photodiode PD2A before this signal is processed as described above in order to generate a transmission signal Tr representative of losses of the optical cavity 120 induced for example by absorption of a gas in the resonant optical cavity 120.

Figure 2B:
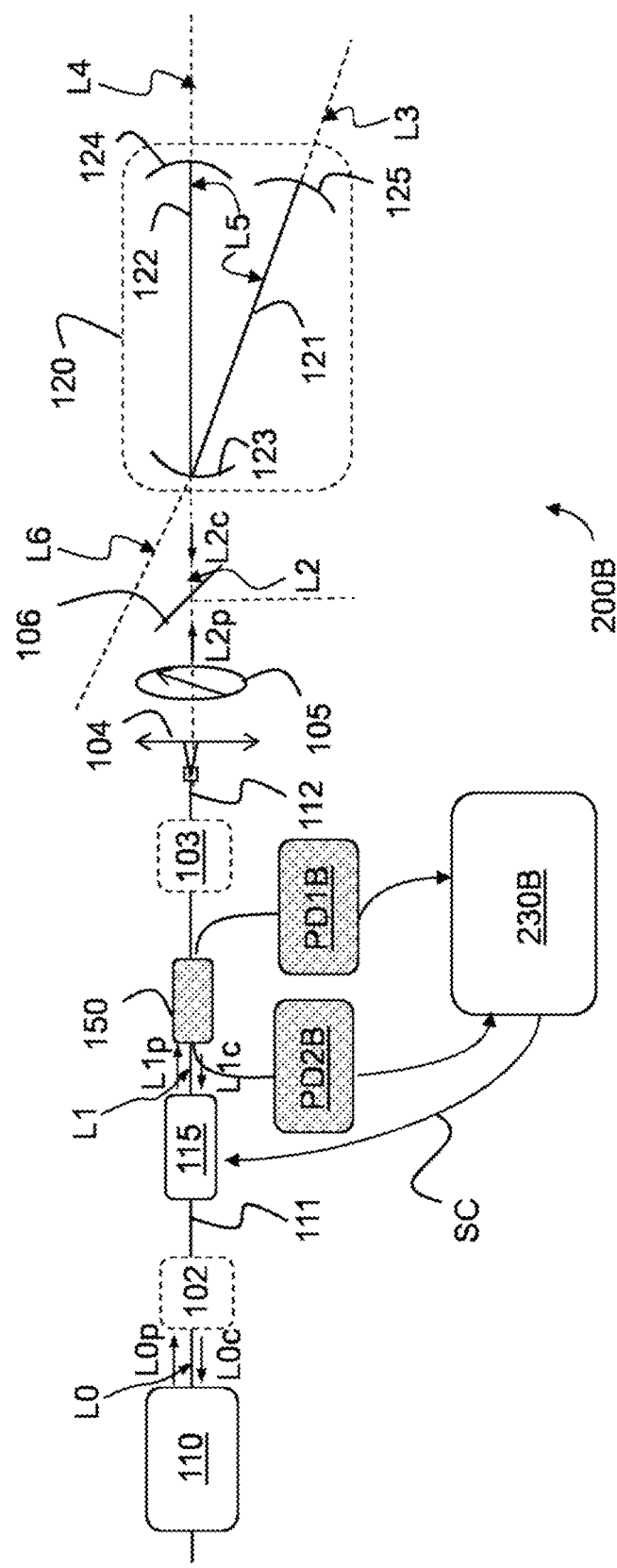

FIG. 2B schematically illustrates one embodiment of a laser system 200B with optical feedback using a second method for generating a signal for controlling an electro-optical modulator.

The laser system 200B comprises a laser 110, which is sensitive to optical feedback, a resonant optical cavity 120, an optical fiber 111, an optical fiber 112 and a fiber-based electro-optical modulator 115, these elements being identical or similar to those described with reference to FIG. 1 and optically connected as illustrated in FIG. 1. The laser system 200B may furthermore comprise the optical components 102, 103, 104, 105, 106 described with reference to FIG. 1.

The laser system 200B furthermore comprises a fiber-based fiber-optic coupler 150 in order to sample a fraction of the optical wave L1 at the output of the electro-optical modulator 115.

The laser system 200B furthermore comprises a photodiode PD1B at the output of the fiber-based coupler 150 for generating, from a fraction of the forward-propagating optical wave L1p coming from the laser 110, an electrical current the magnitude of which depends on the light intensity of the sampled wave fraction. The photodiode PD1B plays a role equivalent to that played by the photodiode PD1A described with reference to FIG. 2A in that the intensities of the optical signals received by these photodiodes are proportional.

The laser system 200B furthermore comprises a photodiode PD2B at the output of the fiber-based coupler 150 for generating, from a fraction of the optical wave L1c coming from the resonant optical cavity 120, an electrical current the magnitude of which depends on the light intensity of the sampled wave fraction. Likewise, the photodiode PD2B plays a role equivalent to that played by the photodiode PD2A described with reference to FIG. 2A in that the intensities of the optical signals received by these photodiodes are proportional.

The laser system 200B furthermore comprises a phase-controlling device 230B configured to obtain an error signal SE representative of the laser/cavity phase shift and to generate the signal SC for controlling the fiber-based electro-optical modulator 115 depending on the error signal SE so as to cancel out the relative laser/cavity phase. The phase-controlling device 230B is configured to generate the control signal SC from the back-propagating optical wave L1c, representative of the fraction of the back-propagating wave L5c transmitted via the folding mirror 123 and, optionally, from the forward-propagating optical wave L1p, representative of the forward-propagating wave L2p at the input of the resonant optical cavity 120. More precisely, the control signal SC is generated from electrical currents generated by the photodiode PD2B, and, optionally, by the photodiode PD1B.

The operating principle of the phase-controlling device 230B is identical to that of the phase-controlling device 230A: the signal generated by the photodiode PD2B is used, instead of the signal generated by the photodiode PD2A, to generate, as described with reference to FIG. 2A, the error signal SE and the control signal SC. Optionally, the signal generated by the photodiode PD1B is used, instead of the signal generated by the photodiode PD1A, to normalize the electrical signal generated by the photodiode PD2B before this signal is processed as described with reference to FIG. 2A.

Figure 2C:
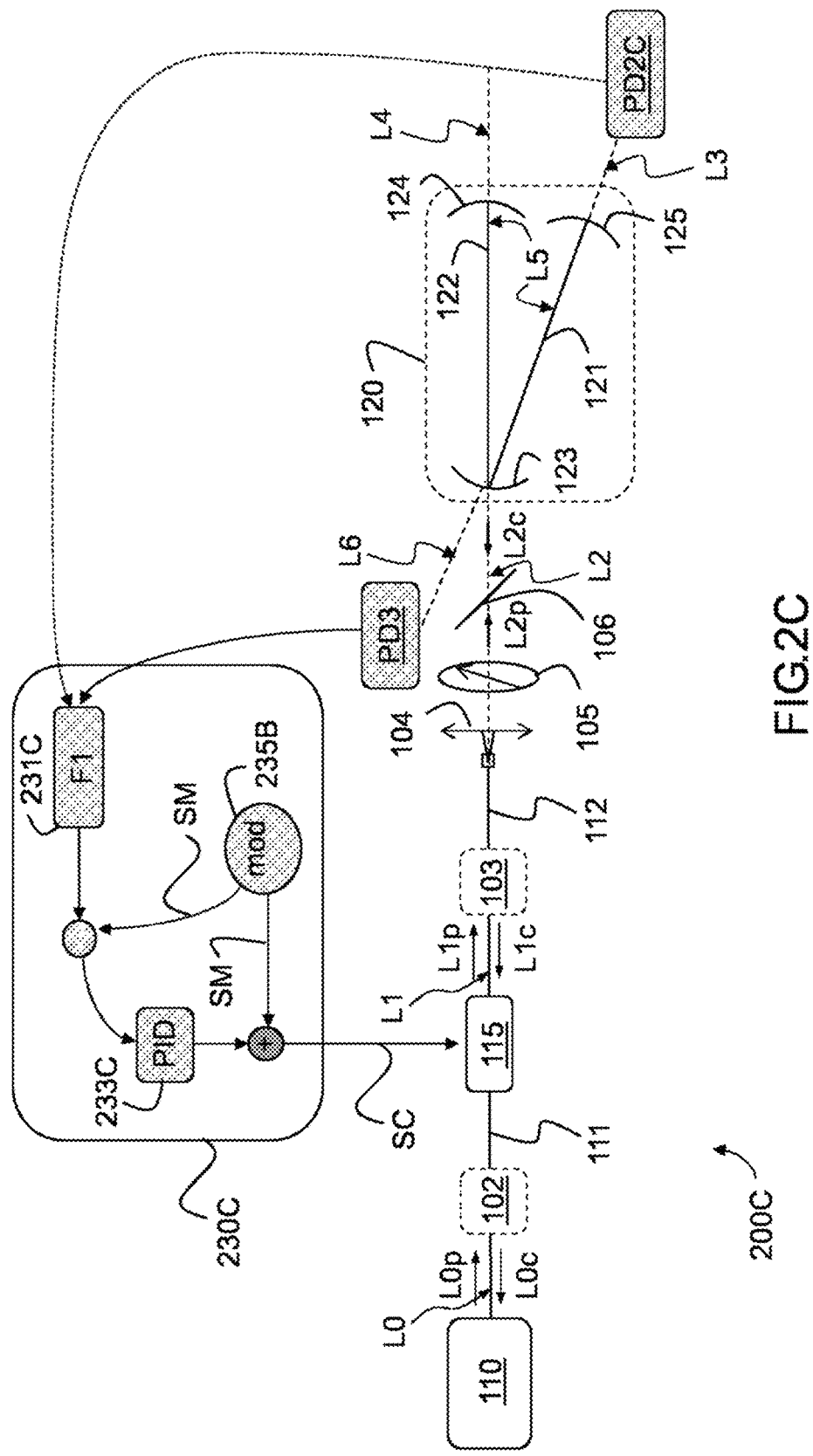

FIG. 2C schematically illustrates one embodiment of a laser system 200C with optical feedback using a third method for generating a signal for controlling the electro-optical modulator. The laser system 200C comprises a laser 110, which is sensitive to optical feedback, a resonant optical cavity 120, an optical fiber 111, an optical fiber 112 and a fiber-based electro-optical modulator 115, these elements being identical or similar to those described with reference to FIG. 1 and optically connected as illustrated in FIG. 1. The laser system 200C may furthermore comprise the optical components 102, 103, 104, 105, 106 described with reference to FIG. 1.

The laser system 200C furthermore comprises a photodiode PD3 for generating, from the optical wave L6, an electrical current the magnitude of which depends on the optical wave L6 resulting from the interference between the back-propagating optical wave L5c and the optical wave L2r reflected by the folding mirror 123.

The laser system 200C may furthermore comprise a photodiode PD2C for generating, from the optical wave L3, an electrical current the magnitude of which depends on the light intensity of the optical wave L3.

The laser system 200C furthermore comprises a phase-controlling device 230C configured to obtain an error signal SE representative modulo $2\pi$ of the laser/cavity phase shift and to generate the signal SC for controlling the fiber-based electro-optical modulator 115 depending on the error signal SE so as to cancel out the relative laser/cavity phase. The phase-controlling device 230C is configured to generate the control signal SC from the optical wave L6. More precisely, the phase-controlling device 230A is configured to generate the control signal SC from the signal generated by the photodiode PD3.

The principle of the method for generating the control signal SC here consists in measuring the relative optical phase between the fraction of the intra-cavity wave L5 transmitted via the folding mirror 123 of the cavity and the forward-propagating source optical wave L0p emitted by the laser. The optical wave L6 resulting from the mixture of these two waves is generated by reflection from the folding mirror 123 of the resonant optical cavity 120. The optical path of the optical wave L6 is geometrically separate from the optical path used for coupling the laser 110 and the resonant optical cavity 120. It is therefore possible to install a photodiode PD3 without disrupting this coupling.

A modulation signal SM is generated with a phase-modulation frequency that may be chosen between 100 kHz (i.e. about 10 to 20 times the width of the modes of the cavity) and 10 GHz (this limit depending on the modulation capabilities of the employed electro-optical modulator 115). The error signal SE is obtained by applying a bandpass filter 231C to the signal generated by the photodiode PD3, then by modulating the filtered signal with the modulation signal SM. A PID controller 233C generates, from the error signal SE input into the PID controller, a correction signal to which the modulation signal SM is added so as to generate the control signal SC.

The relative phase between the fraction of the back-propagating intra-cavity wave L5c transmitted via the folding mirror 123 and the forward-propagating source optical wave L0p depends on the deviation with respect to the exact resonance, i.e. depends on the optimal degree of coupling between the laser 110 and the resonant optical cavity 120. FIG. 3D shows the variation in this relative phase as a function of the mismatch to the frequency of the source laser expressed in fraction of free spectral interval of the resonant optical cavity 120. As illustrated in FIG. 3D, this relative phase passes from $-\pi$ to $+\pi$ and is equal to zero at the exact resonance.

The main advantage of this third method for generating the control signal is due to the fact that photons stored in the resonant optical cavity 120, which are temporally filtered, form a reservoir that is very stable on the scale of several tens of microseconds. The resonant optical cavity 120 acts as a source of ultra-stable frequency. Thus, any action on the laser 110 at a timescale shorter than this response time of the cavity will be instantaneously detected.

Since it is possible to measure relative phase very rapidly, it is therefore possible to ensure an extremely rapid control of the relative phase. The electro-optical modulator 115, which allows an almost instantaneous phase adjustment, is once again here fully taken advantage of (response time<0.1 ns).

Optionally, the signal generated by the photodiode PD2C is used to normalize the electrical signal generated by the photodiode PD3 before this signal is processed as described above.

Figure 2D:
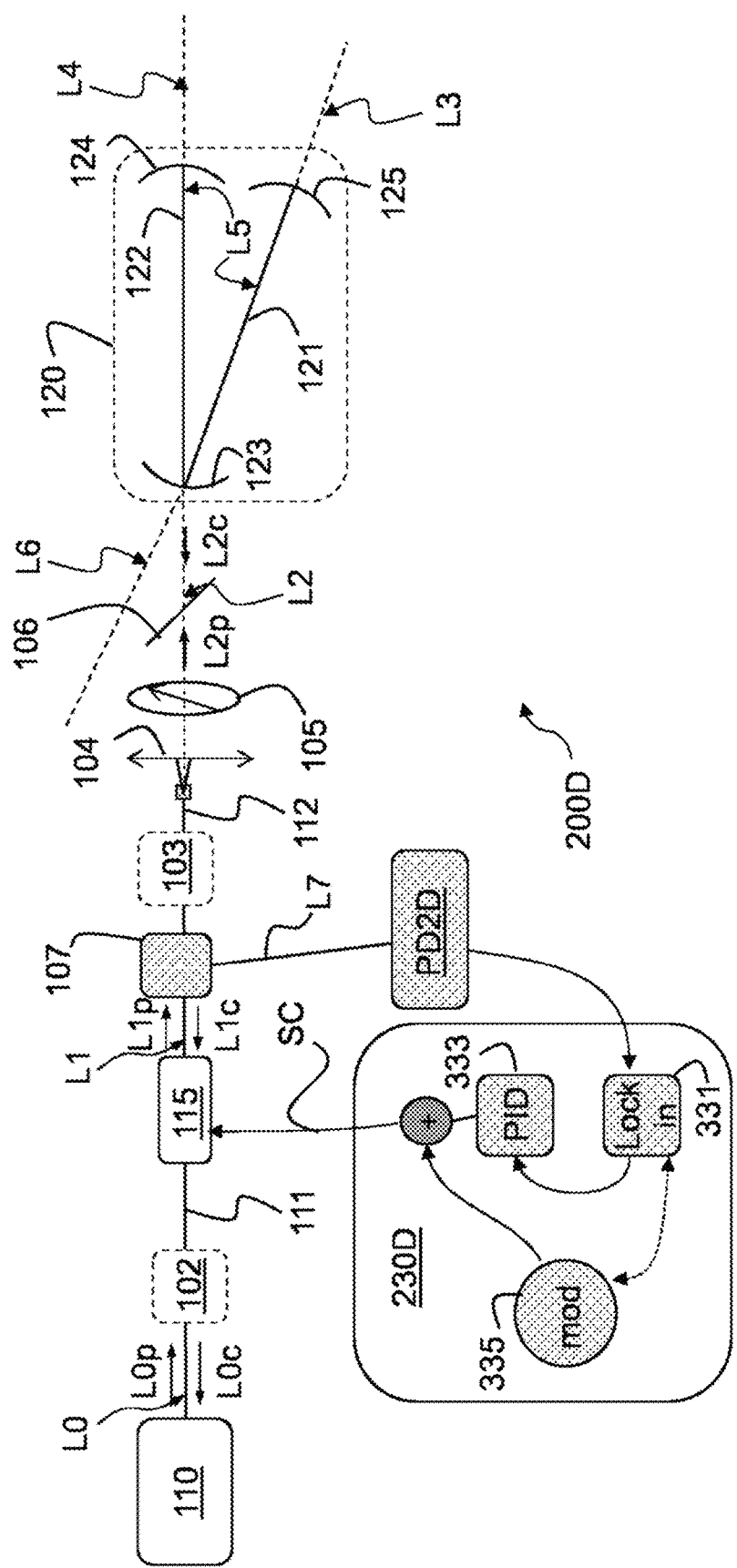

FIG. 2D schematically illustrates one embodiment of a laser system 200D with optical feedback using a fourth method for generating a signal for controlling the electro-optical modulator. The laser system 200D comprises a laser 110, which is sensitive to optical feedback, a resonant optical cavity 120, an optical fiber 111, an optical fiber 112 and a fiber-based electro-optical modulator 115, these elements being identical or similar to those described with reference to FIG. 1 and optically connected as illustrated in FIG. 1. The laser system 200D may furthermore comprise the optical components 102, 103, 104, 105, 106 described with reference to FIG. 1.

The laser system 200D furthermore comprises a fiber-based coupler 107 for sampling some of the back-propagating optical wave L1c from the optical fiber 112 and for generating an optical wave L7.

The laser system 200D furthermore comprises a photodiode PD2D for generating, from the optical wave L7, an electrical current the magnitude of which depends on the light intensity of the optical wave L7.

The laser system 200D furthermore comprises a phase-controlling device 230D configured to obtain an error signal SE representative of the laser/cavity phase shift and to generate the signal SC for controlling the fiber-based electro-optical modulator 115 depending on the error signal SE so as to cancel out the relative laser/cavity phase. The phase-controlling device 230D is configured to generate the control signal SC from the optical wave L1 at the output of the electro-optical modulator 115. More precisely, the control signal SC is generated depending on the obtained error signal SE, via a so-called lock-in detection method in which a phase modulation is applied to the forward-propagating source optical wave L0p, this modulation being applied about an average value. The control signal SC is generated so as to make an adjustment to the average value of the phase of the forward-propagating source optical wave L0p, while the phase modulation is applied to the same forward-propagating source optical wave L0p. This phase modulation induces a modulation of the intensity of the intra-cavity wave L5 and therefore of the intra-cavity back-propagating wave L5c. Since the back-propagating optical wave L1c is representative of the back-propagating optical wave L5c, this intensity modulation is detected by the photodiode PD2D on the basis of a fraction of the back-propagating optical wave L1c sampled via the optical circulator 107. The error signal is obtained by a lock-in amplifier 331 via demodulation of the signal generated by the photodiode PD2D. This lock-in detection method is described in more detail below with reference to FIGS. 3A-3D.

Figure 2E:
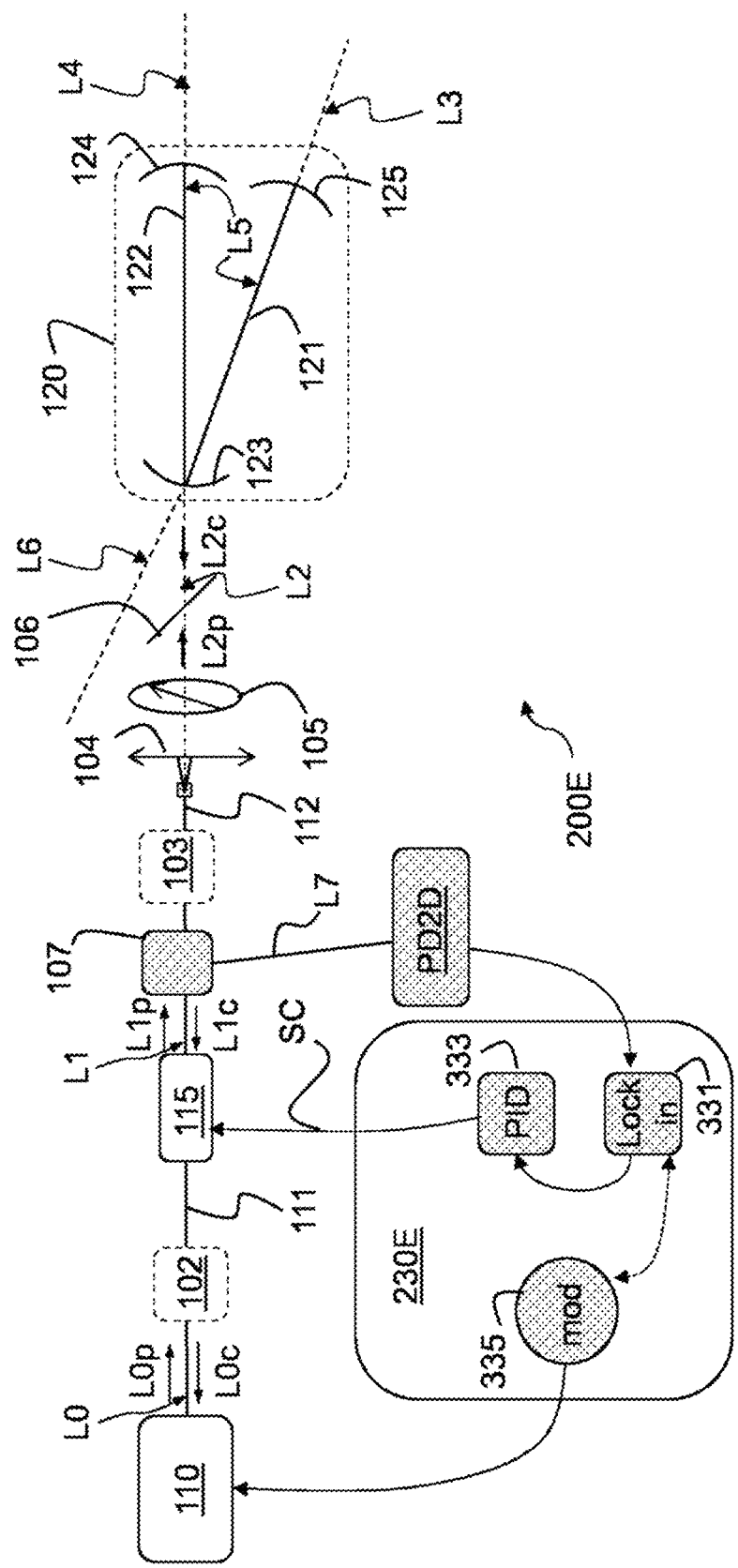

FIG. 2E schematically illustrates one embodiment of a laser system 200E with optical feedback using a fifth method for generating a signal for controlling the electro-optical modulator.

The laser system 200E is identical to the laser system 200D except that the laser system 200E comprises a phase-controlling device 230E that is configured to obtain an error signal SE representative of the laser/cavity phase shift and to generate the modulation signal SM of the laser 110 and the control signal SC depending on the error signal SE so as to cancel out the relative laser/cavity phase. The phase-controlling device 230E is configured to generate the control signal SC from the optical wave L1 at the output of the electro-optical modulator 115. More precisely, the control signal SC is generated via a lock-in detection method, in which the magnitude of the current supplied to the diode of the laser 110 is modulated in order to induce a modulation of the frequency of the laser. This induces a modulation of the intensity of the intra-cavity wave L5 and therefore of the intra-cavity back-propagating wave L5c. Since the back-propagating optical wave L1c is representative of the back-propagating optical wave L5c, this intensity modulation is detected by the photodiode PD2D on the basis of a fraction of the back-propagating optical wave L1c sampled by the optical circulator 107. The error signal SE is obtained via a lock-in amplifier 331 via demodulation of the signal generated by the photodiode PD2D. The control signal SC is generated so as to make, depending on the obtained error signal SE, an adjustment to an average value of the phase of the forward-propagating source optical wave L0p, while the modulation of the magnitude of the current supplied to the diode of the laser 110 is applied. This lock-in detection method is described in more detail below with reference to FIGS. 3A-3D.

FIGS. 3A to 3D illustrate various aspects of the generation of the signal SC for controlling the electro-optical modulator 115 via a lock-in detection method.

Figure 3A:
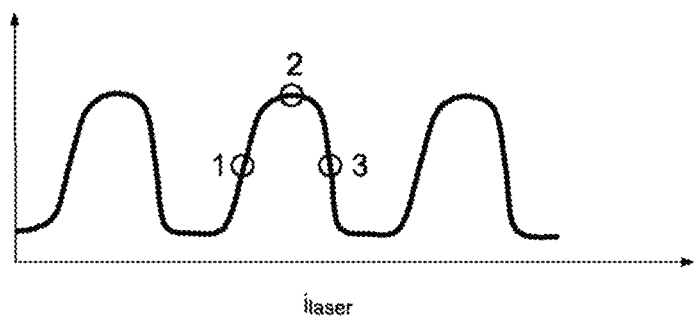
FIGS. 3A-3D illustrate various aspects of the generation of a signal for controlling the electro-optical modulator according to one or more embodiments.

FIG. 3A is a transmission curve representing the intensity of the optical wave L3 or L4 transmitted by the resonant optical cavity 120 as a function of time when the frequency of the forward-propagating source optical wave L0p is varied. This frequency variation is for example obtained by making the magnitude of the current $I_{laser}$ supplied to the diode internal to the laser 110 vary. When the laser 110 is tuned by optical feedback to one of the resonant frequencies of the resonant optical cavity 120, photons are effectively injected into the resonant optical cavity 120 and accumulate therein, this leading to optical waves L3, L2c, L4 or L6 being output by transmission from the resonant optical cavity 120. In contrast, when the laser 110 is not tuned, photons are not effectively injected and little or no light is output by transmission from the resonant optical cavity 120. The effectiveness of the coupling between the laser 110 and the resonant optical cavity 120 may thus be measured via the intensity of one of the optical waves L3, L2c, L1c, L4 or L6 output from the resonant optical cavity 120. As illustrated in FIG. 3A, this intensity follows a sort of bell curved the peak of which corresponds to an optimal coupling situation. In other words, the optimization of the degree of coupling amounts to maximizing the intensity of one of the optical waves L3, L2c, L1c, L4, or L6 output from the resonant optical cavity 120.

Various examples of operating points (1), (2) and (3) on the transmission curve are shown in FIG. 3A. At the operating point (1), the derivative of the transmission curve is positive: the intensity of the transmitted optical wave increases when the frequency of the laser source (i.e. the current $I_{laser}$) increases and decreases when the frequency of the laser source (i.e. the current $I_{laser}$) decreases. At operating point 3), the derivative of the transmission curve is negative: the intensity of the transmitted optical wave decreases when the frequency of the laser source (i.e. the current $I_{laser}$) increases and increases when the frequency of the laser source (i.e. the current $I_{laser}$) decreases. At the operating point (2), the degree of coupling is optimum and the derivative of the transmission curve is zero: the intensity of the transmitted optical wave is unaffected by the change in the frequency of the laser source (i.e. in the current $I_{laser}$).

Figure 3B:
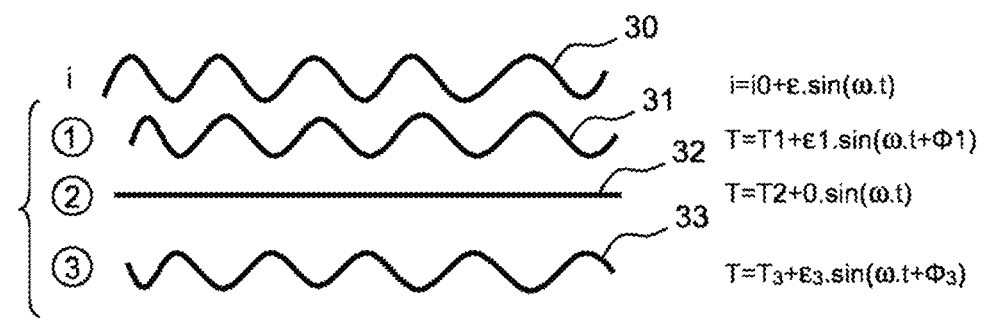

The curves of FIG. 3B illustrate the behavior of the laser system when a modulation signal SM=ε sin ωt of small amplitude is applied to the current $I_{laser}$. The curve 30 shows the current $I_{laser}$=I(t)+ε sin ωt that is applied to the diode of the laser (ε>0). The frequency ω is for example about several kHz. The curve 31 represents the (essentially sinusoidal) transmission curve of the laser obtained about the operating point (1) with such a modulation: the increasing portions of the sinusoidal wave have a higher slope in absolute value than the decreasing portions of the sinusoidal wave, this amounting to a positive modulation of the phase Φ1 of the transmission curve $I_{laser}$=I(t)+ε1 sin(ωt+Φ1). The curve 32 represents the transmission curve of the laser obtained about the operating point (2) with such a modulation: the transmission curve is substantially constant (i.e. zero phase modulation Φ2 and zero amplitude modulation ε2 with $I_{laser}$=I(t)+ε2 sin(ωt+Φ2)). The curve 33 represents the (essentially sinusoidal) transmission curve of the laser obtained about the operating point (3) with such a modulation: the increasing portions of the sinusoidal wave have a lower slope in absolute value than the decreasing portions of the sinusoidal wave, this amounting to a negative modulation of the phase Φ3 of the transmission curve $I_{laser}$=I(t)+ε3 sin(ωt+Φ3). It may thus be seen that it is possible to detect many times per second the value of the derivative of the transmission curve with respect to current and therefore to determine the adjustment necessary to obtain an optimal degree of coupling between the laser 110 and the resonant optical cavity 120.

In the embodiments of FIGS. 2D and 2E, this detection may be achieved with a lock-in amplifier 331 that in particular allows the amplitude and relative phase of a signal (here the modulated transmission signal) with respect to a sinusoidal reference signal (here, the signal SM used to modulate the emission frequency of the laser via modulation of the electrical current $I_{laser}$). In at least one embodiment of the lock-in detection amplifier 331, the input signal is amplified, then multiplied by the modulation signal in order to generate the modulated signal. Then a bandpass filter allows the modulated signal to be integrated.

In the embodiments of 2D and 2E, the output of the lock-in amplifier 331 is connected to a PID controller 333 (PID for proportional, integral, derivative) that allows, from the error signal SE output from the lock-in detection amplifier 331, a control signal SC generated so as to cancel out the relative laser/cavity phase to be generated.

In the embodiments of FIG. 2A, 2C, 2D or 2E, the PID controller 233A, 233C, 333 generates, from the error signal SE input into this PID controller 233A, 233C, 333, a control signal SC that is the weighted sum of 3 components obtained from the error signal SE: a proportional component corresponding to the error signal SE, an integral component obtained by integrating the error signal SE and a derivative component obtained by differentiating the error signal SE. The integral component of the control signal is used to filter slow changes in the error signal and the derivative component of the control signal is used to filter rapid changes in the error signal. Because of these three components, system stability may be ensured. The control signal SC reaches, from above or below, an optimal value $SM_0$ when the error signal SE reaches zero, i.e. when the transmission of the resonant optical cavity is maximum and the degree of laser/cavity coupling is maximum. Furthermore, the control signal may continue to increase or decrease in order to follow the phase variations to be compensated. When this optimal value $SM_0$ is reached, the electro-optical modulator makes a phase adjustment ΔΦ1 to the source wave issued from the laser and a total phase adjustment ΔΦ=ΔΦ1+ΔΦ2=2*ΔΦ1 on a there/back laser/cavity trip of the source wave. Furthermore, the proportional component of the control signal SC increases or decreases, with respect to the optimal value $SM_0$, in proportion to the magnitude of the error signal SE.

In the embodiment of FIGS. 2C and 2D, the modulation signal SM is furthermore used to modulate the output signal of the PID controller 233A, 233C, 333 so as to generate a modulated control signal SC that is also the weighted sum of 3 components obtained from the error signal SE: a proportional component corresponding to the error signal SE, an integral component obtained by integrating the error signal SE and a derivative component obtained by differentiating the error signal SE. The average value, about which the control signal SC is modulated, reaches an optimal value when the error signal SE reaches zero (i.e. when the transmission of the resonant optical cavity is maximum and the degree of laser/cavity coupling is maximum). Furthermore, the proportional component of the control signal SC increases or decreases in proportion to the magnitude of the error signal SE.

The intensity of the optical wave L3, L1c, L2c, L4, or L6 output from the resonant optical cavity 120 may thus serve as an input signal for generating an error signal SE representative of the laser/cavity phase shift.

For a given emission frequency of the laser 110, the degree of coupling between the laser 110 and the resonant optical cavity 120 may be adjusted by adjusting the phase of the forward-propagating optical wave L1p output from the electro-optical modulator 115 to an average value such that the laser/cavity optical path is equal to an integer number of wavelengths λ, where λ is the wavelength of the forward-propagating source optical wave L0p.

Rather than modulate the frequency of the laser 110, it is possible, as shown in FIG. 2D, to modulate, by means of the electro-optical modulator 115, the phase of the optical wave L1 at the output of the electro-optical modulator. This makes it possible to keep the current supplied to the diode of the laser 110 constant, i.e. to guarantee that the emission power of the laser 110 remains stable. This makes it possible, when a fraction of the forward-propagating source optical wave L0p generated by the laser 110 is sampled, for example by means of a fiber-optic coupler, to obtain an optical wave that is not disrupted by the modulation, while achieving a laser that is both fine and stable in wavelength and in power.

Figure 3C:
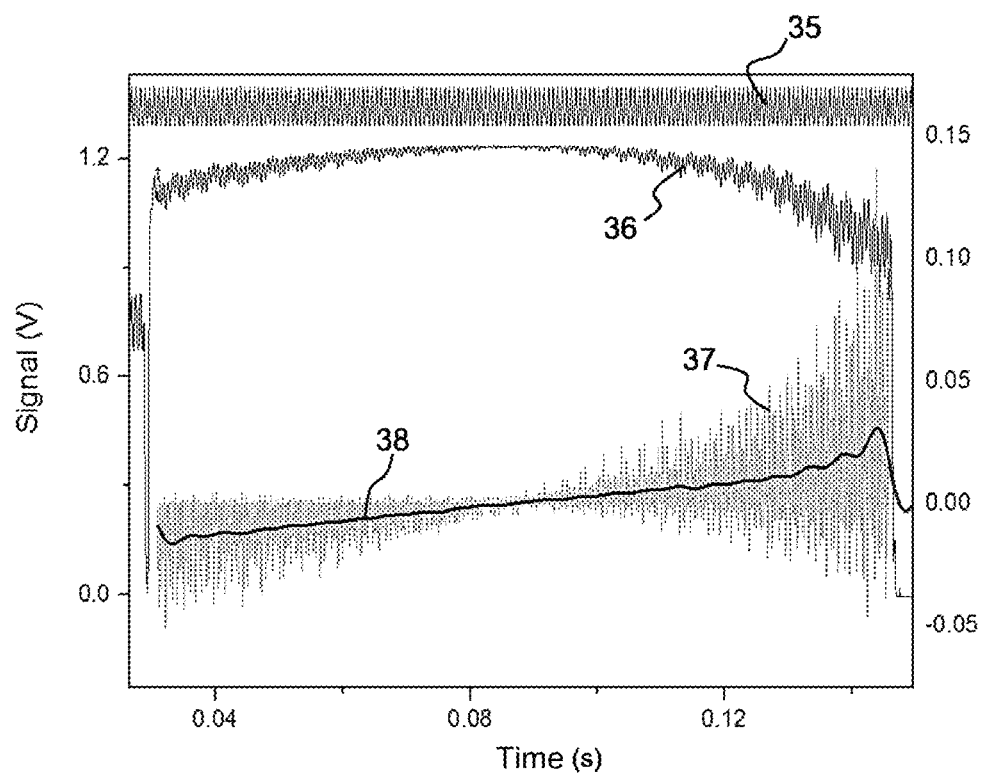
Figure 3D:
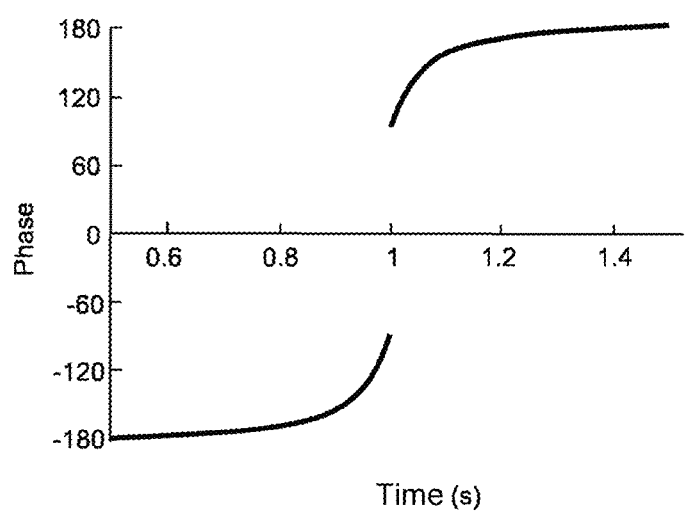

FIG. 3C shows a plurality of signals obtained by means of the laser systems 200D or 200E. The curve 35 (scale to the left of the curve) shows an example of a modulation signal SM with a modulation frequency of 1.4 kHz. The curve 36 (left-hand scale) represents an optical wave L3 or L4 output from the resonant optical cavity 120 in case of modulation of the magnitude of the current $I_{laser}$ supplied to the diode internal to the laser 110. It may be seen that the effect of the modulation reaches zero at the end of a time about equal to 0.09 s corresponding to the peak of the curve 36, at which a value of 1.2 V is reached: this peak corresponds to a maximum degree of laser/cavity coupling. The curve 37 (right-hand scale) represents the signal resulting from modulating, with the modulation signal SM, an optical wave L3 or L4 output from the resonant optical cavity 120. It may also be seen from this curve 37 that the effect of the modulation reaches zero at the end of a time about equal to 0.09 s corresponding to the peak of the curve 36. The curve 38 (right-hand scale) is the error signal SE obtained by low-pass filtering (for example with a cut-off frequency of 200 Hz) of the signal represented by the curved 37. The signal SC for controlling the electro-optical modulator 115 is obtained by applying a PID correction to the signal represented by the curve 38. The derivative of the curve 38 reaches zero at the end of a time about equal to 0.09 seconds, for an average magnitude of about 0.25 V, corresponding to the peak of the curve 36 or 37. The control signal SC is thus generated so that it reaches an optimal value when the curve 38 reaches zero, and the proportional component of the control signal SC increases in proportion to the difference with respect to the magnitude of the curve 38 at the point where the curve 38 reaches zero, i.e. at the point corresponding to the maximum laser/cavity coupling and therefore to the maximum transmission.

Figure 4:
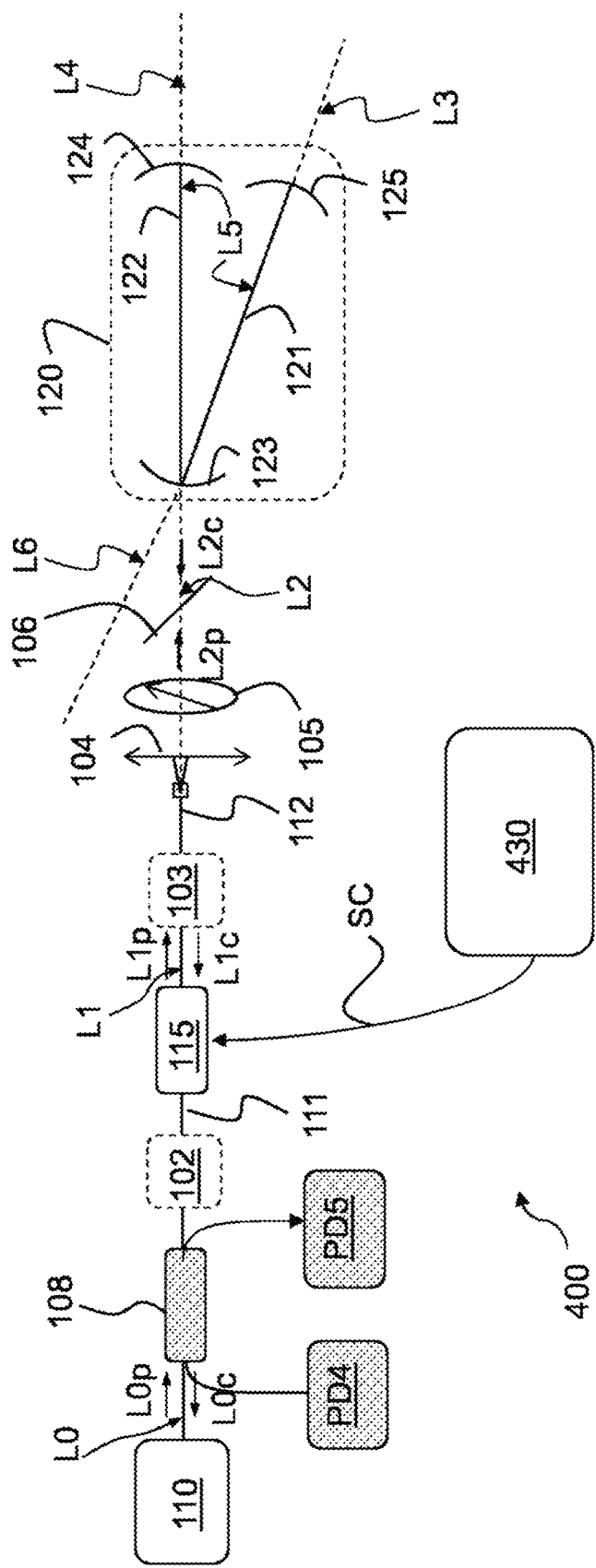
FIG. 4 illustrates another embodiment of a laser system with optical feedback.

FIG. 4 schematically illustrates another embodiment of a laser system 400 with optical feedback. This embodiment may be combined with any one of the embodiments described with reference to FIGS. 1 and 2A to 2E.

The laser system 400 comprises a laser 110, which is sensitive to optical feedback, a resonant optical cavity 120, an optical fiber 111, an optical fiber 112 and a fiber-based electro-optical modulator 115, these elements being identical or similar to those described with reference to FIG. 1 and optically connected as illustrated in FIG. 1. The laser system 400 may furthermore comprise the optical components 102, 103, 104, 105, 106 described with reference to FIG. 1.

The laser system 400 furthermore comprises a phase-controlling device 430 configured to obtain an error signal SE representative modulo 2π of the laser/cavity phase shift and to generate the signal SC for controlling the fiber-based electro-optical modulator 115 depending on the error signal SE so as to cancel out the relative laser/cavity phase. The control signal SC may be generated using any one of the methods described with reference to FIGS. 2A-2E.

The laser system 400 comprises a fiber-optic coupler 107 for sampling a portion of the source optical wave L0 at the output of the laser 110. A photodiode PD4 is connected to a first output of the coupler 107 and receives a fraction (for example 10%) of the back-propagating source optical wave L0c that is returned to the laser 110. A photodiode PD5 is connected to a second output of the coupler 107 and receives a fraction (for example 90%) of the forward-propagating source optical wave L0p that exits from the laser. The optical output signal, viewed on the photodiode PD5 forms an ultra-stable high-power optical source.

Figure 5:
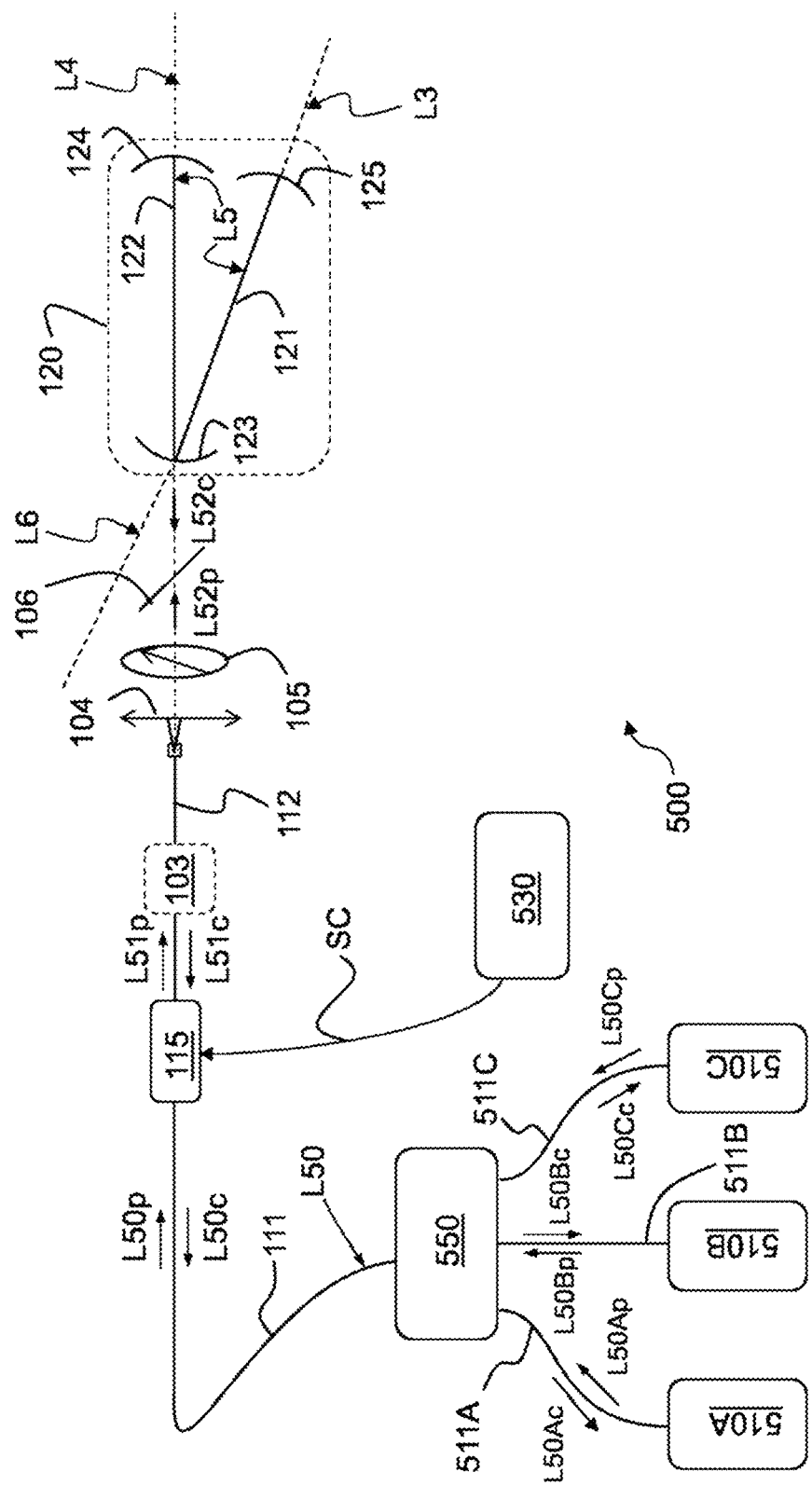
FIG. 5 illustrates one embodiment of a multi-source laser system with optical feedback.

FIG. 5 schematically illustrates one embodiment of a multi-source laser system 500 with optical feedback. This laser system 500 comprises at least two lasers that are sensitive to optical feedback and that are intended to emit, via an output optical fiber, a continuous-waveform source optical wave the frequency of which is adjustable. In the example illustrated in FIG. 5, the laser system 500 comprises three lasers (510A, 510B, 510C) that are sensitive to optical feedback and that are intended to emit, via a corresponding output optical fiber 511A to 511C, respectively, a corresponding continuous-waveform forward-propagating source optical wave (L50Ap, L50Bp, L50Cp) the frequency of which is adjustable. The description of the embodiment of FIG. 5 is given for a number of lasers equal to 3 but is generalizable to any number of lasers.

The laser system 500 comprises a resonant optical cavity 120 that is coupled by optical feedback to one of the lasers (510A, 510B, 510C) and configured to generate an intra-cavity wave L5. The resonant optical cavity 120 may be identical or similar to the resonant optical cavity 120 described with reference to any one of FIGS. 1 and 2A to 2E.

The laser system 500 furthermore comprises an optical fiber 111, an optical fiber 112 and a fiber-based electro-optical modulator 115, these elements being identical or similar to those described with reference to FIGS. 1 and 2A to 2E and optically connected as illustrated in these figures. The laser system 500 may furthermore comprise the optical components 102, 103, 104, 105, 106 described with reference to FIG. 1.

The laser system 500 comprises a fiber-based optical switch 550 that is configured to receive the forward-propagating optical waves L50Ap-L50Cp output by the lasers 510A-510C, respectively, for selecting one of the received optical waves and for transferring, to the electro-optical modulator 115, the selected forward-propagating optical wave L50, via the optical fiber 111. The selected optical wave L50p serves as forward-propagating source optical wave, the electro-optical modulator 115 being configured to adjust (and optionally modulate) the phase of the selected optical wave L50p as described with reference to FIGS. 1 and 2A to 2E so as to generate a forward-propagating optical wave L51p that is phase-shifted with respect to the forward-propagating source optical wave L50p. In case of modulation, the phase-shifted forward-propagating optical wave L51p furthermore has modulation sidebands. The optical feedback from the resonant optical cavity 120 is therefore delivered to the laser 510A to 510C that generated the selected optical wave L50p.

The stationary intra-cavity optical wave L5 that forms in the resonant optical cavity 120 is composed of a back-propagating intra-cavity wave L5c and a forward-propagating intra-cavity wave L5p. The back-propagating intra-cavity wave L5c is reinjected via a reverse path into the lasers (510A, 510B, 510C), giving rise to the optical feedback effect. The optical feedback may occur between each of the lasers (510A, 510B, 510C) and the resonant optical cavity 120.

The optical wave L52 at the input of the resonant optical cavity 120 is thus composed of a forward-propagating wave L52p and a back-propagating wave L52c. In particular, the back-propagating wave L52c corresponds to the fraction of the back-propagating intra-cavity wave L5c transmitted through the folding mirror 123 on the axis of the optical arm 122.

Likewise, the optical wave L51 at the output of the electro-optical modulator 115 is composed of the forward-propagating wave L51p and a back-propagating wave L51c. The back-propagating wave L51c corresponds to the fraction of the back-propagating intra-cavity wave L5c that reaches the output of the electro-optical modulator 115. Since the action of the electro-optical modulator 115 is identical in both propagation directions, it modifies by an identical amount, and in the same way, the phase of the forward-propagating source wave L0p and the phase of the back-propagating wave L51c.

Likewise, the optical wave L50 at the output of the optical switch 550 is composed of the forward-propagating source wave L50p, generated by the optical switch 550 as described above, and a back-propagating wave L50c. The back-propagating wave L50c corresponds to the fraction of the back-propagating optical wave L5c that reaches the output of the optical switch 550.

The optical switch 550 acts in the back-propagation direction so as to perform the inverse function to that performed in the forward-propagation direction and thus generates a back-propagating wave L50Ac, L50Bc, L50Cc that is returned to the laser 510A, 510B, 510C the forward-propagating source wave of which was selected by the optical switch 550 in the forward-propagation direction.

Thus, the optical wave L50A (L50B, L50C, respectively) at the output of the laser 510A (510B, 510C, respectively) is composed of the forward-propagating source wave L50Ap (L50Bp, L50Cp, respectively) and a back-propagating wave L50Ac (L50Bc, L50Cc, respectively).

Each of the back-propagating waves L52c, L51c, L50c, L50Ac, L50Bc, L50Cc thus result from the back-propagating wave L5c.

The laser system 500 furthermore comprises a phase-controlling device 530 configured to obtain an error signal SE representative modulo $2\pi$ of the laser/cavity phase shift accumulated on the there-back laser-cavity trip corresponding to the laser 510A-510C that emitted the forward-propagating source optical wave selected by the optical switch 550 and to generate the control signal SC for controlling the fiber-based electro-optical modulator 115 depending on the error signal SE as to cancel out the relative laser/cavity phase corresponding to the laser 510A-510C that emitted the selected forward-propagating source optical wave. The control signal SC may be generated using any one of the methods described with reference to FIGS. 1 and 2A to 2E.

The embodiments described with reference to FIG. 5 allow one of the source lasers to be rapidly switched to with a view, for example, to changing telecom communication channel or to changing spectral range in the context of analysis of the absorption by the intra-cavity substance 120, i.e., concretely, in order to allow low-cost multi-gas analyzers to be designed with a single resonant optical cavity and a plurality of laser sources.

Figure 6:
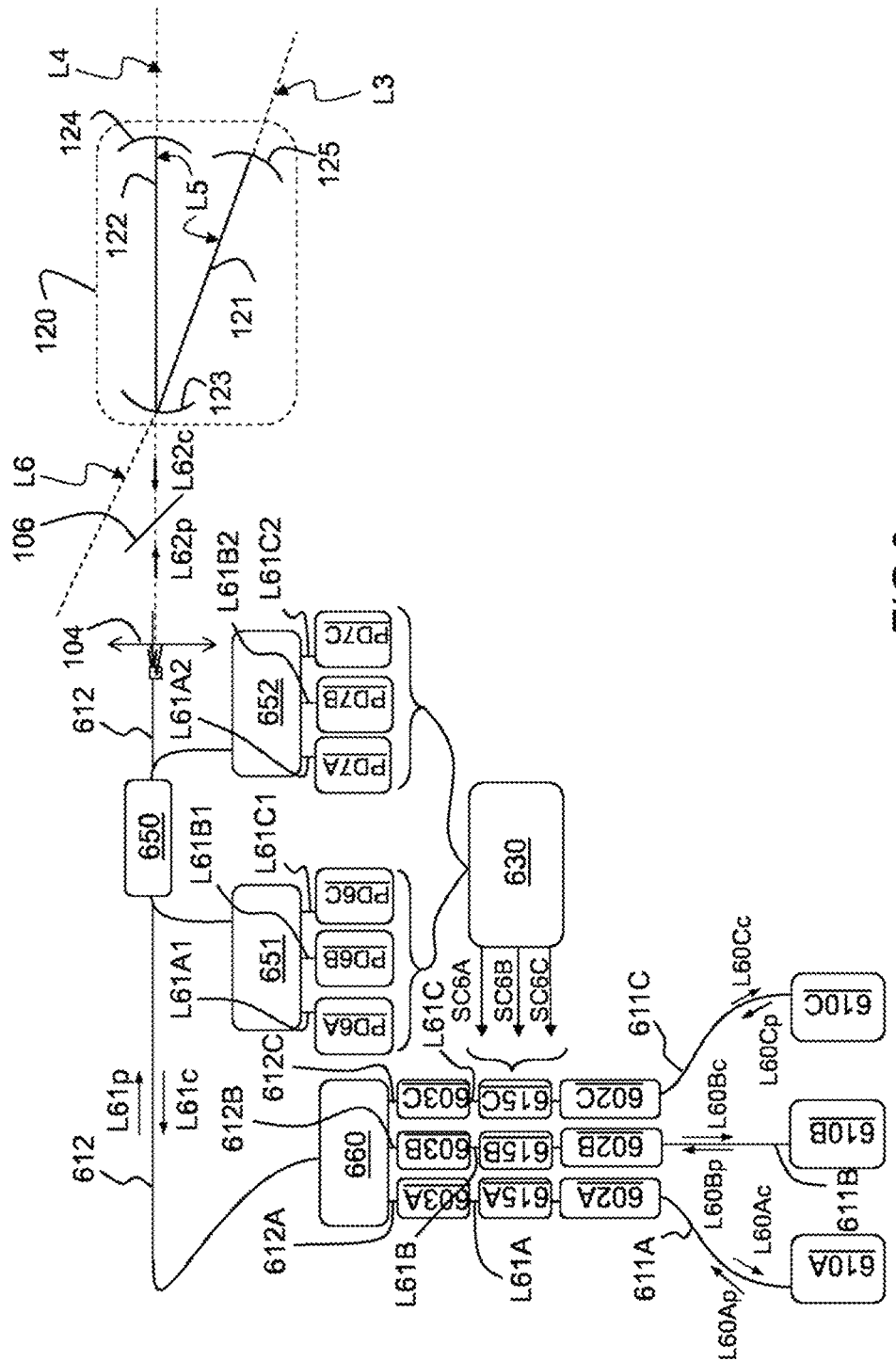
FIG. 6 illustrates another embodiment of a multi-source laser system with optical feedback.

FIG. 6 schematically illustrates another embodiment of a multi-source laser system 600 with optical feedback. This laser system 600 comprises at least two lasers that are sensitive to optical feedback and that are intended to emit, via an output optical fiber, a continuous-waveform source optical wave the frequency of which is adjustable. In the example illustrated in FIG. 6, the laser system 600 comprises three lasers (610A, 610B, 610C) that are sensitive to optical feedback and that are intended to emit, via a corresponding output optical fiber (611A, 611B, 611C) a corresponding continuous-waveform forward-propagating source optical wave (L60Ap, L60B, L60C) the frequency of which is adjustable, respectively. The description of the embodiment of FIG. 6 is given for a number of lasers equal to 3 but is generalizable to any number of lasers.

Each optical fiber (611A, 611B, 611C) is identical or similar to the optical fiber 111 described with reference to any one of FIGS. 1, 2A, 2B and 2C.

The laser system 600 comprises a resonant optical cavity 120 that is coupled by optical feedback to each of the lasers (610A, 610B, 610C) and that is configured to generate an intra-cavity wave L5. The resonant optical cavity 120 may be identical or similar to the resonant optical cavity 120 described with reference to any one of FIGS. 1, 2A, 2B and 2C.

The laser system 600 furthermore comprises, for each laser (610A, 610B, 610C), a corresponding fiber-based electro-optical modulator (615A, 615B, 615C) that may be identical or similar to the fiber-based electro-optical modulator 115 described with reference to any one of FIGS. 1, 2A, 2B and 2C.

The laser system 600 furthermore comprises, for each electro-optical modulator (615A, 615B, 615C), an output optical fiber (612A, 612B, 612C) that is identical or similar to the optical fiber 112 described with reference to any one of FIGS. 1, 2A, 2B and 2C.

Each of the electro-optical modulators (615A, 615B, 615C) is configured to adjust (and optionally modulate) the phase of the corresponding forward-propagating source optical wave (L60Ap, L60Bp, L60Cp) so as to generate a corresponding forward-propagating phase-shifted optical wave (L61Ap, L61Bp, L61Cp) in an identical way to that described for the electro-optical modulator 115 with reference to any one of FIGS. 1 and 2A to 2E. In case of modulation, the phase-shifted forward-propagating optical wave (L61Ap, L61Bp, L61Cp) furthermore has modulation sidebands.

The laser system 600 furthermore comprises a phase-controlling device 630 for generating a control signal (SC6A, SC6B, SC6C) for each of the electro-optical modulators (615A, 615B, 615C). Each of the control signals (SC6A, SC6B, SC6C) is determined by the phase-controlling device 630 so as to cancel out, modulo $2\pi$, for each laser (610A, 610B, 610C), the laser/cavity phase shift accumulated on each of the there-back laser-cavity trips.

The laser system 600 furthermore comprises a multiplexer 660 for injecting, into the same fiber, the phase-shifted forward-propagating optical waves (L61Ap, L61Bp, L61Cp) and for generating a multiplexed forward-propagating optical wave L61p via an output optical fiber 612. The wavelength multiplexing (wavelength demultiplexing, WDM) is carried out so that the frequency bands of the phase-shifted forward-propagating optical waves L61Ap-L61Cp may be respectively multiplexed or demultiplexed into or from a single fiber. In at least one embodiment, these frequency bands are separate bands.

One or more lenses 104 may be placed at the output of the optical fiber 612 in order to collimate the forward-propagating optical wave L61p that exits from the optical fiber 612 and to generate a forward-propagating optical wave L62p. The forward-propagating optical wave L62p is transmitted through free space before being injected into the resonant optical cavity 120. One or more plate beamsplitters 106 may be placed on the optical path of the forward-propagating optical wave L62p in order to sample a forward-propagating fraction of the forward-propagating optical wave L62.

The stationary intra-cavity optical wave L5 that forms in the resonant optical cavity 120 is composed of a back-propagating intra-cavity wave L5c and a forward-propagating intra-cavity wave L5p. The back-propagating intra-cavity wave L5c is reinjected via a reverse path into the laser 610A-610C, giving rise to the optical feedback effect. The optical feedback occurs between each of the lasers (610A, 610B, 610C) and the resonant optical cavity 120.

Thus, the optical wave L62 at the input of the resonant optical cavity 120 is composed of a forward-propagating wave L62b and a back-propagating wave L62c. In particular, the back-propagating wave L62c corresponds to the fraction of the back-propagating optical wave L5c transmitted through the folding mirror 123 on the axis of the optical arm 122.

Likewise, the optical wave L61 at the output of the multiplexer 660 is composed of the forward-propagating wave L61p, generated by the multiplexer 660 as described above, and a back-propagating wave L61c. The back-propagating wave L61c corresponds to the fraction of the back-propagating optical wave L5c that reaches the output of the multiplexer 660.

The multiplexer 660 acts in the back-propagation direction as a demultiplexer so as to separate the frequency components of the back-propagating wave L61c by performing the inverse function to that performed in the propagation direction and thus to generate the back-propagating waves L61Ac, L61Bc, L61Cc.

Thus, the optical wave L61A (L61B, L61C, respectively) at the output of the electro-optical modulator 615A (615B, 615C, respectively) is composed of the forward-propagating phase-shift wave L61Ap (L61Bp, L61Cp, respectively) and a back-propagating wave L61Ac (L61Bc, L61Cc, respectively). The electro-optical modulator 615A (615B, 615C, respectively) is configured to, in the forward-propagation direction, modify the phase of the forward-propagating source wave L60Ap (L60Bp, L60Cp, respectively), and, in the back-propagation direction, to modify the phase of the back-propagating wave L61Ac (L61Bc, L61Cc, respectively). Since the action of the electro-optical modulator 615A (615B, 615C, respectively) is identical in both propagation directions, it modifies by an identical amount, and in the same way, both the phase of the forward-propagating source wave L60Ap (L60Bp, L60Cp, respectively) and the phase of the back-propagating wave L61Ac (L61Bc, L61Cc, respectively).

The optical wave L60A (L60B, L60C, respectively) at the output of the laser 610A (610B, 610C, respectively) is composed of the forward-propagating source wave L60Ap (L60Bp, L60Cp, respectively) generated by the laser 610A (610B, 610C, respectively) and a back-propagating wave L60Ac (L60Bc, L60Cc, respectively) that is returned to the laser 610A (610B, 610C, respectively). The back-propagating wave L60Ac (L60Bc, L60Cc, respectively) corresponds to the fraction of the back-propagating optical wave L5c that reaches the output of the laser 610A (610B, 610C, respectively).

Each of the back-propagating waves L62c, L61c, L61Ac, L61Bc, L61Cc, L60Ac, L60Bc, L60Cc thus results from the back-propagating wave L5c.

The laser system 600 furthermore comprises a fiber-based coupler 650 that is placed on the optical fiber 612 and that is configured to sample, in the propagation direction, some of the forward-propagating optical wave L61p and, in the back-propagation direction, some of the back-propagating optical wave L61c. The coupler 650 comprises two output fibers, a first output fiber 1 and a second output fiber 2.

A multiplexer 651 is placed on the first output fiber 1 of the coupler 650 so as to sample, in the back-propagation direction, fractions L61A1, L61B1, L61C1 of the back-propagating optical wave L61c that correspond to the frequency bands of the phase-shifted waves L61Ap, L61Bp, L61Cp input into the multiplexer 660, respectively. A corresponding photodiode PD6A, PD6B, PD6C is used to generate, from the corresponding optical waves L61A1, L61B1, L61C1, an electrical current the magnitude of which depends on the light intensity of the corresponding optical wave. Alternatively, the fractions L61A1, L61B1, L61C1 of the multiplexed optical wave L61 may be sampled on one of the sections of optical fiber connecting a laser (610A, 610B, 610C) to the multiplexer 660, for example at the output of the electro-optical modulators (615A, 615B, 615C).

A multiplexer 652 is placed on the second output fiber 2 of the coupler 650 so as to sample, in the forward-propagation direction, fractions L61A2, L61B2, L61C2 of the forward-propagating optical wave L61p that correspond to the frequency bands of the phase-shifted waves L61Ap, L61Bp, L61Cp input into the multiplexer 660, respectively. A corresponding photodiode PD7A, PD7B, PD7C is used to generate, from the corresponding optical waves L61A2, L61B2, L61C2, an electrical current the magnitude of which depends on the light intensity of the corresponding optical wave L61A2, L61B2, L61C2. Alternatively, the fractions L61A2, L61B2, L61C2 of the multiplexed optical wave L61 may be sampled on one of the sections of optical fiber connecting a laser (610A, 610B, 610C) to the multiplexer 660, for example at the output of the electro-optical modulators (615A, 615B, 615C).

The phase-controlling device 630 is configured to generate an error signal SE6A (SE6B, SE6C, respectively) representative, modulo $2\pi$, of the laser/cavity phase shift accumulated on the there-back laser-cavity trip corresponding to the laser 610A (610B, 610C, respectively) and to generate the signal SC6A (SC6B, SC6C, respectively) for controlling the fiber-based electro-optical modulator 615A (615B, 615C, respectively) depending on the error signal SE6A (SE6B, SE6C, respectively) so as to cancel out the relative laser/cavity phase corresponding to the laser 610A (610B, 610C, respectively). The control signal SC6A (SC6B, SC6C, respectively) may be generated using the method described with reference to FIG. 2B, in which the photodiode PD7A (PD7B, PD7C, respectively) plays the role of the photodiode PD1B and the photodiode PD6A (PD6B, PD6C, respectively) plays the role of the photodiode PD2B.

The laser system 600 may furthermore comprise fiber-based optical component 602A to 602C (603A to 603C, respectively) that are identical to the component 102 (103, respectively) described with reference to FIG. 1, and that are placed before or after each of the corresponding electro-optical modulators (615A, 615B, 615C).

This system allows the same cavity 120 to be used to simultaneously provide feedback to a plurality of lasers. The gas-detecting instruments may thus analyze several spectral regions in parallel and continuously. It is also possible to provide a plurality of ultra-stable sources that are connected together via the optical cavity 120 for metrological applications, telecoms applications or applications that require very precise combinations (for example by optical beating, summing or subtraction) of frequencies, for the generation of terahertz radiation for example.

Figure 7:
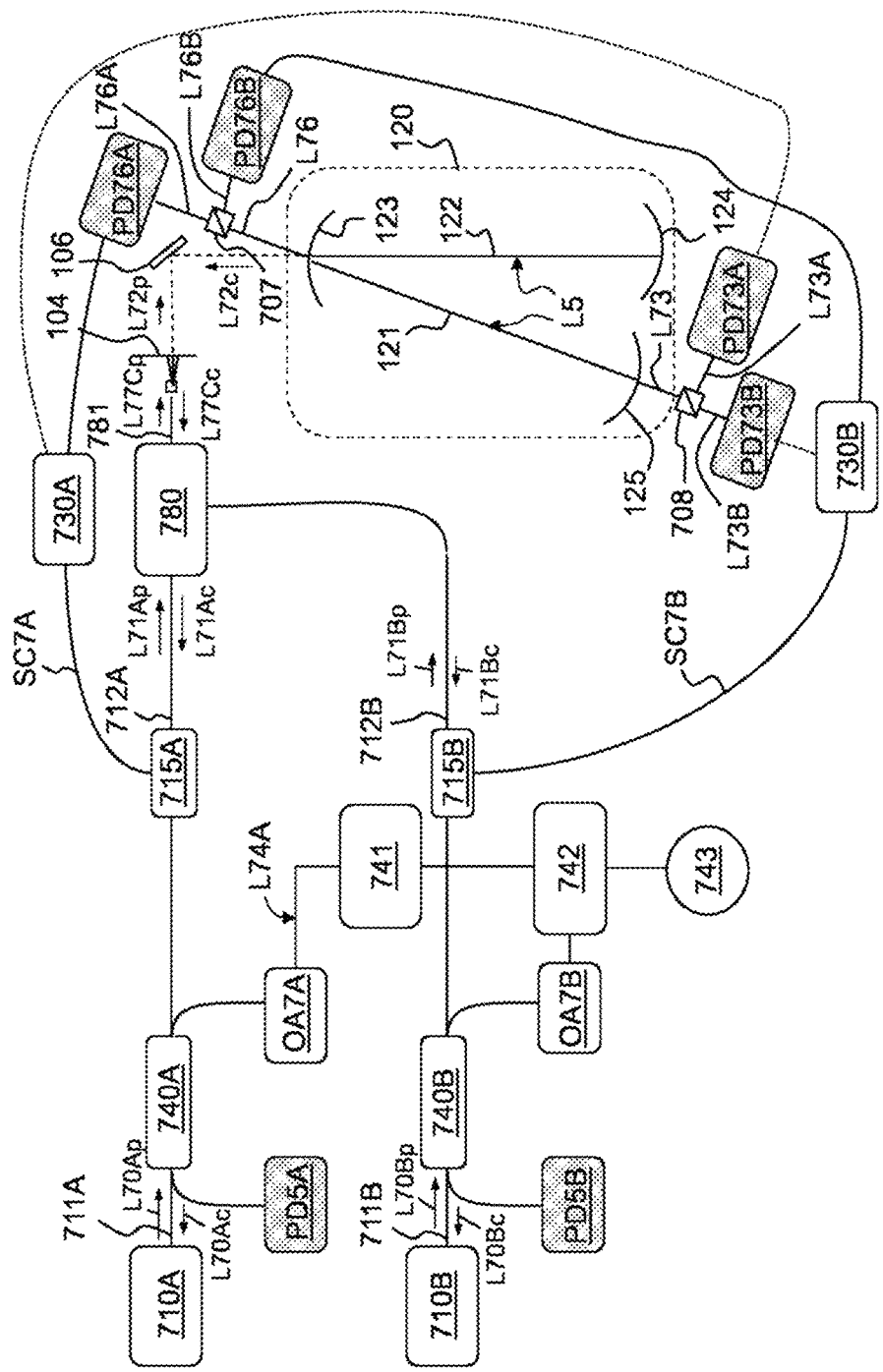
FIG. 7 illustrates another embodiment of a multi-source laser system with optical feedback.

FIG. 7 schematically illustrates another embodiment of a multi-source laser system 700 with optical feedback. This laser system 700 comprises at least two lasers that are sensitive to optical feedback and that are intended to emit, via an output optical fiber, a continuous-waveform forward-propagating source optical wave the frequency of which is adjustable. In the example illustrated in FIG. 7, the laser system 700 comprises two lasers (710A, 710B) that are sensitive to optical feedback and that are intended to emit, via a corresponding output optical fiber (711A, 711B) a corresponding continuous-wave forward-propagating source optical wave (L70Ap, L70Bp) the frequency of which is adjustable, respectively.

Each optical fiber (711A, 711B) is identical or similar to the optical fiber 111 described with reference to FIG. 1.

The laser system 700 comprises a resonant optical cavity 120 that is coupled by optical feedback simultaneously to each of the lasers (710A, 710B) and that is configured to generate an intra-cavity wave L5. The resonant optical cavity 120 may be identical or similar to the resonant optical cavity 120 described with reference to any one of FIGS. 1 and 2A-2E.

The laser system 700 furthermore comprises, for each laser (710A, 710B), a corresponding fiber-based electro-optical modulator (715A, 715B) that may be identical or similar to the fiber-based electro-optical modulator 115 described with reference to any one of FIGS. 1 and 2A-2E.

The laser system 700 furthermore comprises, for each electro-optical modulator (715A, 715B), an output optical fiber (712A, 712B) that is identical or similar to the optical fiber 112 described with reference to any one of FIGS. 1 and 2A-2E.

Each of the electro-optical modulators (715A, 715B) is configured to adjust (and optionally modulate) the phase of the corresponding forward-propagating source optical wave (L70Ap, L70Bp) and generate a corresponding forward-propagating phase-shifted optical wave (L71Ap, L71Bp) in an identical or similar way to that described for the electro-optical modulator 115 with reference to any one of FIGS. 1 and 2A to 2E. In case of modulation, the phase-shifted forward-propagating optical wave (L71Ap, L71Bp) furthermore has modulation sidebands.

The laser system 700 furthermore comprises an optical combiner 780 for, in the forward-propagation direction, generating, from the first phase-shifted forward-propagating optical wave (L71Ap) and from the second phase-shifted forward-propagating optical wave (L71Bp), a combined forward-propagating wave (L77Cp) comprising two orthogonally polarized waves (L77Ap, L77Bp). In one embodiment, a first forward-propagating polarized optical wave (L77Ap) is obtained by polarizing the first forward-propagating phase-shifted optical wave (L71Ap) and a second forward-propagating polarized optical wave (L77Bp) is obtained by polarizing, orthogonally to the first forward-propagating polarized optical wave, the second forward-propagating phase-shifted optical wave (L71Bp). For example, polarization-maintaining optical fibers are used at the output of the electro-optical modulator 715A and 715B, these fibers being connected to the input of the optical combiner (780) so that their polarization axes are orthogonal. The optical combiner (780) is furthermore configured to supply the resonant optical cavity with the obtained combined forward-propagating wave (L77Cp).

One or more lenses 704 may be placed at the output of the optical fiber 781 in order to collimate the forward-propagating optical wave L77Cp exiting from the optical fiber 781 and to generate a forward-propagating optical wave L72$p$. Just like the forward-propagating optical wave L77Cp, the forward-propagating optical wave L72$p$ comprises two optical waves of orthogonal polarizations. The forward-propagating optical wave L72$p$ is transmitted through space before being injected into the resonant optical cavity 120.

One or more mirrors 706 may be placed on the optical path of the forward-propagating optical wave L72$p$ in order to direct the optical wave L72$p$ toward the input of the resonant optical cavity 120.

A stationary intra-cavity wave L5 forms in the resonant optical cavity 120; it comprises two optical waves of orthogonal polarizations, corresponding to the polarizations of the optical waves L77Ap, L77Bp combined in the forward-propagating combined optical wave L77Cp. Likewise, the forward-propagating intra-cavity wave L5$p$, just like the back-propagating intra-cavity wave L5$p$, comprises two optical waves of orthogonal polarizations, corresponding to the polarizations of the optical waves L77Ap, L77Bp combined in the forward-propagating combined optical wave L77Cp.

Furthermore, when the stationary intra-cavity wave L5 forms in the resonant optical cavity 120, the back-propagating optical wave L5$c$ is reinjected via a reverse path into the lasers 710A, 710B, giving rise to the optical feedback effect. The optical feedback occurs between each of the lasers (710A, 710B) and the resonant optical cavity 120.

Thus, the optical wave L72 at the input of the resonant optical cavity 120 is composed of a forward-propagating wave L72$p$ and a back-propagating wave L72$c$. In particular, the back-propagating wave L72$c$ corresponds to the fraction of the back-propagating optical wave L5$c$ transmitted through the folding mirror 123 on the axis of the optical arm 122. Just like the forward-propagating wave L72$p$, the back-propagating wave L72$c$ comprises two optical waves of orthogonal polarizations, corresponding to the polarizations of the optical waves L77Ap, L77Bp combined in the forward-propagating combined optical wave L77Cp.

Likewise, the optical wave L77C at the output of the optical combiner 780 is composed of the forward-propagating wave L77Cp and a back-propagating wave L77Cc. Just like the forward-propagating wave L77Cp, the back-propagating wave L77Cc comprises two back-propagating optical waves L77Ac, L77Bc of orthogonal polarizations, corresponding to the polarizations of the optical waves L77Ap, L77Bp. In the back-propagation direction, the optical combiner 780 is configured to generate split waves by splitting, in the back-propagating combined optical wave L77Cc that reaches the optical combiner, fractions of orthogonally polarized waves and to generate the back-propagating waves L71Ac and L71Bc.

Likewise, the optical wave L71A (L71B, respectively) at the output of the electro-optical modulator 715A (715B, respectively) is composed of the forward-propagating phase-shifted wave L71Ap (L71Bp, respectively) and a back-propagating wave L71Ac (L71Bc, respectively). The electro-optical modulator 715A (715B, respectively) is configured to, in the forward-propagation direction, modify the phase of the forward-propagating source wave L70Ap (L70Bp, respectively) and to, in the back-propagation direction, modify the phase of the back-propagating wave L71Ac (L71Bc, respectively). Since the action of the electro-optical modulator 715A (715B, respectively) is identical in both propagation directions, it modifies in the same way the phase of the forward-propagating source wave L70Ap (L70Bp, respectively) and the phase of the back-propagating wave L71Ac (L71Bc, respectively).

Likewise, the optical wave L70A (L70B, respectively) at the output of the laser 710A (710B, respectively) is composed of the forward-propagating source wave L70Ap (L70Bp, respectively) generated by the laser 710A (710B, respectively) and a back-propagating wave L70Ac (L70Bc, respectively) that is returned to the laser 710A (710B, respectively). The back-propagating wave L70Ac (L70Bc, respectively) corresponds to the fraction of the back-propagating optical wave L5$c$ that reaches the laser 710A (710B, respectively).

Each of the back-propagating waves L72$c$, L77Cc, L71Ac, L71Bc, L70Ac, L70Bc thus result from the back-propagating wave L5$c$.

The laser system 700 furthermore comprises a beamsplitter 707 placed at the input of the resonant optical cavity, on the axis of the arm 121 of the optical cavity. The beamsplitter 707 receives the optical wave L76. A reflected optical wave L72$r$ results from reflection from the folding mirror 123 of the forward-propagating optical wave L72$p$. In operation, when an intra-cavity stationary wave L5 forms in the resonant optical cavity 120, the optical wave L76, formed at the input of the cavity 120, on the optical axis of the arm 121, results from optical interference between the reflected optical wave L72$r$ and a fraction of the back-propagating intra-cavity wave L5$c$ transmitted via the folding mirror 123 of the resonant optical cavity 120 on the axis of the arm 121 of the resonant optical cavity. In contrast, for the fraction of the back-propagating optical wave L5$c$ transmitted via the folding mirror 123 on the axis of the arm 122 of the resonant optical cavity 120, there is no interference with the forward-propagating optical wave L72$p$. The beamsplitter 707 generates, from the optical wave L76, two optical waves L76A, L76B of distinct polarizations, corresponding to the polarizations of the first polarized optical wave L77Ap and the second polarized optical wave L77Bp, respectively.

The laser system 700 furthermore comprises a photodiode PD76A for generating, from the optical wave L76A, an electrical current the magnitude of which depends on the light intensity of the optical wave L76A.

The laser system 700 furthermore comprises a photodiode PD76B for generating, from the optical wave L76B, an electrical current the magnitude of which depends on the light intensity of the optical wave L76B.

The laser system 700 may furthermore comprise a beam splitter 708 placed at the output of the resonant optical cavity on the axis of the arm 121 of the optical cavity. The beamsplitter 708 receives the optical wave L73 that results from the transmission of a fraction of the forward-propagating intra-cavity wave L5 via the output mirror 125 of the resonant optical cavity 120. The beam splitter 708 generates, from the optical wave L73, two optical waves L73A, L73B of distinct polarizations, corresponding to the polarizations of the first polarized optical wave L77Ap and the second polarized optical wave L77Bp, respectively.

The laser system 700 may furthermore comprise a photodiode PD73A for generating, from the optical wave L73A, an electrical current the magnitude of which depends on the light intensity of the optical wave L73A.

The laser system 700 may furthermore comprise a photodiode PD73B for generating, from the optical wave L73B, an electrical current the magnitude of which depends on the light intensity of the optical wave L73B.

The laser system 700 furthermore comprises one or more phase-controlling devices (730A, 730B) for generating a control signal (SC7A, SC7B) for each of the electro-optical modulators (715A, 715B). Each of the control signals (SC7A, SC7B) determined by one phase-controlling device (730A, 730B) is determined so as to cancel out, modulo $2\pi$, the laser/cavity phase shift accumulated on the there-back laser-cavity trip corresponding to each laser (710A, 710B). Each of the phase-controlling devices (730A, 730B) receives the electrical current generated by the photodiodes PD76A, PD76B (and optionally PD73A, PD73B), which receive an optical wave of polarization corresponding to that of the phase-shifted optical wave in question.

The control signal SC7A (SC7B, respectively) is generated from the corresponding error signal SE7A (SE7B, respectively), this error signal SE7A being obtained from the electrical signal generated by the photodiode PD76A (PD76B, respectively), and optionally from the electrical signal respectively generated by the photodiode PD73A (PD73B, respectively), using the method described with reference to FIG. 2C, wherein the photodiode PD76A (PD76B, respectively) plays the role of the photodiode PD3 and the photodiode PD73A (PD73B, respectively) plays the role of the photodiode PD2C, so as to generate the control signal SC7A (SC7B, respectively), respectively.

The laser system 700 may furthermore comprise a fiber-based coupler 740A that is placed on the optical fiber 711A and that is configured to sample some of the forward-propagating optical wave L40Ap. The coupler 740A has at least one output on which an optical amplifier OA7A may be placed in order to generate a high-power output optical wave L74A.

In at least one embodiment the laser system 700 comprises an optical component for combining the forward-propagating optical waves L70Ap, L70Bp (back-propagating optical waves L70Ac, L70Bc, respectively) at the output of the lasers 710A and 710B. A fraction of these forward-propagating optical waves L70Ap, L70Bp (back-propagating optical waves L70Ac, L70Bc, respectively) is then sampled, for example with an optical coupler or optical circulator. For example, the laser system 700 may furthermore comprise a fiber-based coupler 740B that is placed on the optical fiber 711B and that is configured to sample some of the optical wave L70B. The coupler 740B has at least one output on which an optical amplifier OA7B may be placed in order to generate a high-power output optical wave L74B. The output optical wave L74A and of the output optical wave L74B are stable in frequency, and have a very narrow spectral bandwidth, for example of a few hertz, i.e. a relative precision of 10-14. The laser system 700 may for example furthermore comprise an optical component for combining, for example by optical beating, summing or subtraction, the output optical wave L74A and the output optical wave L74B, so as to obtain an optical wave of higher or lower frequency that is stable in frequency and of high precision.

One possible application of the system 700 is thus the generation of two optical waves the frequency ratio of which is very precise with a view to generating, for example, very pure and widely tunable THz radiation. The system 700 is thus applicable to the detection of heavy molecules: biology, explosives, imaging, telecommunications, etc.

The various laser systems described here with reference to FIGS. 1 to 7 are usable to produce a gas-detecting system. In such a gas-detecting system, the resonant optical cavity defines a chamber intended to receive at least one gas to be analyzed. The gas-detecting system may comprise an analyzing device for analyzing and/or comparing one or more optical waves produced by the laser system. For example, the analyzing device is configured to determine a ratio between the light intensities of an optical wave output from the resonant optical cavity and of an optical wave input into the resonant optical cavity. In at least one embodiment, the frequency of the one or more light sources is made to vary and the ratio of light intensities is measured for each frequency so as to obtain a frequency spectrum. In the case of the multi-source laser systems described with reference to FIGS. 5 to 7, an analysis may be carried out simultaneously or alternately at the various frequencies of the various light sources.

According to one embodiment, a CRDS (Cavity Ring Down Spectroscopy) measurement is performed. In this embodiment, the emission of the source wave by the laser is interrupted, once the cavity has been filled with photons, and the lifetime of the photons in the cavity is measured. This lifetime depends on the reflectivity of the mirrors but also on losses by absorption in the gas present in the cavity. The laser could be interrupted using an electro-optical modulator configured to greatly attenuate the laser wave (>60 dB) or by an amplifier (element 103) placed after the electro-optical modulator in the forward-propagation direction, and that is interrupted (attenuation>80 dB).

The present description relates to a method for generating a laser source by means of a laser system according to any one of the embodiments described here. In at least one embodiment, this method comprises generating a continuous-waveform forward-propagating source optical wave (L0p; L50Ap, L60Ap, L70Ap), called the source wave, the frequency of which is adjustable. The source wave is generated by means of a laser (110; 510A; 610A; 710A) that is sensitive to optical feedback, via an output optical fiber (111; 511A; 611A; 711A) of the laser.

In at least one embodiment, this method comprises coupling, by optical feedback, the laser to a resonant optical cavity (120) that is configured to generate an intra-cavity wave (L5) a fraction of which is returned to the laser in the form of a back-propagating wave.

In at least one embodiment, this method comprises generating, with a fiber-based electro-optical modulator placed on the optical path of the source wave, between the laser and the resonant optical cavity, a phase-shifted source wave (L1p; L51Ap, L61Ap, L71Ap) by phase shifting the source wave and, by phase shifting the back-propagating optical wave, a phase-shifted back-propagating wave (L0c; L50Ac, L60Ac, L70Ac), called the feedback wave, which reaches the laser.

In at least one embodiment, this method comprises generating a signal (SC; SC6A, SC7A) for controlling the electro-optical modulator from an error signal (SE) representative of the relative phase between the source wave and the feedback wave, so as to cancel out the relative phase between the source wave and the feedback wave. The control signal may be generated using any one of the methods described with reference to FIGS. 2A-2E, 5, 6 and 7. This method is applicable to the various laser systems described in this document with reference to FIGS. 1, 2A to 2E, and FIGS. 4 to 7.

The invention claimed is:

1. A laser system with optical feedback comprising:
   a laser that is sensitive to optical feedback and intended to emit, via an output optical fiber, a continuous-waveform forward-propagating source optical wave, being a source wave, a frequency of which is adjustable;
   a resonant optical cavity that is coupled by optical feedback to the laser and that is configured to generate an intra-cavity wave a fraction of which is returned to the laser in the form of a back-propagating optical wave; a fiber-based electro-optical modulator placed on an optical path between the laser and the resonant optical cavity, the electro-optical modulator being configured to generate a phase-shifted source wave by phase shifting the source wave and to generate, by phase shifting the back-propagating optical wave, a phase-shifted back-propagating wave, being a feedback wave, which reaches the laser;

a phase-controlling device for generating a signal for controlling the electro-optical modulator from an error signal representative of a relative phase between the source wave and the feedback wave, so as to cancel out the relative phase between the source wave and the feedback wave.

2. The laser system as claimed in claim 1, wherein:
the resonant optical cavity is formed by at least two mirrors including at least one output mirror,
the phase-controlling device is configured to generate the signal for controlling the electro-optical modulator from a fraction of the intra-cavity wave that exits from the resonant optical cavity via said output mirror.

3. The laser system as claimed in claim 1, wherein
the resonant optical cavity is formed by at least two mirrors including an input mirror,
the phase-controlling device is configured to generate the signal for controlling the electro-optical modulator from a wave resulting from interference between a fraction of the phase-shifted source wave reflected by the input mirror and a fraction of the intra-cavity wave transmitted in the back-propagation direction via the input mirror.

4. The laser system as claimed in claim 1, wherein the phase-controlling device is configured to generate the signal for controlling the electro-optical modulator from a fraction of the back-propagating optical wave sampled at the input of the electro-optical modulator in the back-propagation direction.

5. The laser system as claimed in claim 1, wherein the electro-optical modulator is furthermore configured to generate a modulated optical signal by modulating, depending on the error signal, a phase of the source wave about an average value and the phase-controlling device is configured to produce the control signal via a lock-in detection method from a fraction of the back-propagating optical wave sampled at the input of the electro-optical modulator in the back-propagation direction.

6. The laser system according to claim 1, wherein the output optical fiber is a polarization-maintaining fiber.

7. The laser system as claimed in claim 1, wherein the laser is devoid of an optical isolator at its output.

8. The laser system as claimed in claim 1, comprising at least one fiber-based optical component placed on an optical path of the source wave, before or after the fiber-based electro-optical modulator, the fiber-based optical component being a component selected from the group made up of an optical amplifier, an optical coupler, and an optical circulator.

9. The laser system as claimed in claim 1, comprising:
at least one second laser that is sensitive to optical feedback and that emits, via an output optical fiber, a second continuous-waveform forward-propagating source optical wave a frequency of which is adjustable;
a fiber-based optical switch configured to receive the forward-propagating source optical waves output from the first laser and said at least one second laser, for selecting one of the received forward-propagating source optical waves and for transferring, to the fiber-based electro-optical modulator, the selected forward-propagating source optical wave.

10. The laser system as claimed in claim 1, comprising:
at least one second laser that is sensitive to optical feedback and that emits, via an output optical fiber, a corresponding second continuous-waveform forward-propagating source optical wave a frequency of which is adjustable;
at least one second fiber-based electro-optical modulator placed on an optical path between a corresponding said second laser and the resonant optical cavity, each said second electro-optical modulator being configured to generate a phase-shifted forward-propagating optical wave by phase shifting a corresponding said second forward-propagating source optical wave;
a fiber-based optical multiplexer configured to receive the phase-shifted forward-propagating optical waves output from the electro-optical modulator and said at least one second electro-optical modulator, for generating a multiplexed optical wave by frequency multiplexing the received phase-shifted forward-propagating optical waves, for supplying the resonant optical cavity with the multiplexed wave and for generating demultiplexed waves by demultiplexing a fraction of the intra-cavity wave that reaches the multiplexer in the form of a back-propagating optical wave,
each said second electro-optical modulator furthermore being configured to generate, by phase shifting one of the demultiplexed waves, a corresponding back-propagating optical wave that reaches the corresponding second laser,
the phase-controlling device being configured to generate a control signal for each second electro-optical modulator from an error signal representative of the relative phase between a corresponding second forward-propagating source optical wave and the corresponding back-propagating optical wave reaching the corresponding second laser, so as to cancel out a relative phase between the corresponding forward-propagating source optical wave and the corresponding back-propagating optical wave.

11. The laser system as claimed in claim 1, comprising:
a second laser that is sensitive to optical feedback and that emits, via an output optical fiber, a second continuous-waveform forward-propagating source optical wave a frequency of which is adjustable;
a second fiber-based electro-optical modulator placed on an optical path between the second laser and the resonant optical cavity, the second electro-optical modulator being configured to generate a second phase-shifted forward-propagating optical wave by phase shifting the second forward-propagating source optical wave;
an optical combiner for generating, from a first phase-shifted forward-propagating optical wave generated by the electro-optical modulator and the second phase-shifted forward-propagating optical wave, a combined wave comprising two orthogonally polarized waves, for supplying the resonant optical cavity with the combined wave and for generating split waves by splitting, in a fraction of the intra-cavity wave that reaches the optical combiner in the form of a back-propagating optical wave, fractions of orthogonally polarized waves;

the second electro-optical modulator furthermore being configured to phase shift one of the split waves and to produce a second back-propagating optical wave that reaches the second laser, the laser system furthermore comprising a second phase-controlling device for generating a second signal for controlling the second electro-optical modulator from a second error signal representative of a relative phase between the second forward-propagating source optical wave and the second back-propagating optical wave, so as to cancel out the relative phase between the second forward-propagating source optical wave and the second back-propagating optical wave.

12. A system for generating an optical wave comprising a laser system as claimed in claim 11 and an optical component for generating a combined optical wave by combining a fraction of the source wave and of the feedback wave, respectively, at the output of the laser and a fraction of the second forward-propagating source optical wave and of the second back-propagating optical wave, respectively, at the output of the second laser.

13. A gas-detecting system, wherein the resonant optical cavity defines a chamber intended to receive at least one gas, the gas-detecting system comprising:

a laser system as claimed in claim 1, an analyzing device for analyzing at least one optical wave generated by the laser system.

14. A method for generating an optical wave, comprising generating a continuous-waveform forward-propagating source optical wave, being a source wave, a frequency of which is adjustable, via an output optical fiber of a laser that is sensitive to optical feedback;

coupling, by optical feedback, the laser to a resonant optical cavity configured to generate an intra-cavity wave a fraction of which is returned to the laser in the form of a back-propagating optical wave;

generating, with a fiber-based electro-optical modulator placed on an optical path of the source wave between the laser and the resonant optical cavity, a phase-shifted source wave by phase shifting the source wave and, by phase shifting the back-propagating optical wave, a phase-shifted back-propagating wave, being a feedback wave, which reaches the laser;

and generating a signal for controlling the electro-optical modulator from an error signal representative of a relative phase between the source wave and the feedback wave, so as to cancel out the relative phase between the source wave and the feedback wave.

\* \* \* \* \*